US008680591B2

(12) United States Patent
Haddad et al.

(10) Patent No.: US 8,680,591 B2
(45) Date of Patent: Mar. 25, 2014

(54) PHOTOSENSITIVE IMAGING DEVICES AND ASSOCIATED METHODS

(75) Inventors: Homayoon Haddad, Beaverton, OR (US); Jutao Jiang, Tigard, OR (US); Jeffrey McKee, Tualatin, OR (US); Drake Miller, Tigard, OR (US); Leonard Forbes, Corvallis, OR (US); Chintamani Palsule, Lake Oswego, OR (US)

(73) Assignee: Sionyx, Inc., Beverly, MA (US)

(*) Notice: Subject to any disclaimer, the term of this patent is extended or adjusted under 35 U.S.C. 154(b) by 311 days.

(21) Appl. No.: 12/885,158

(22) Filed: Sep. 17, 2010

(65) Prior Publication Data

US 2011/0227138 A1    Sep. 22, 2011

Related U.S. Application Data

(60) Provisional application No. 61/243,434, filed on Sep. 17, 2009, provisional application No. 61/311,004, filed on Mar. 5, 2010, provisional application No. 61/311,107, filed on Mar. 5, 2010.

(51) Int. Cl.
*H01L 31/062* (2012.01)

(52) U.S. Cl.
USPC .............................. 257/291; 438/71

(58) Field of Classification Search
USPC .......... 257/291, 432, 290, E21.128, E31.085, 257/414, 433, 436, 431; 438/71, 48
See application file for complete search history.

(56) References Cited

U.S. PATENT DOCUMENTS

| | | | |
|---|---|---|---|
| 3,487,223 A | 12/1969 | St. John | |
| 4,201,450 A | 5/1980 | Trapani | |
| 4,242,149 A | 12/1980 | King et al. | |
| 4,277,793 A | 7/1981 | Webb | |
| 4,419,533 A | 12/1983 | Czubatyj et al. | |
| 4,493,942 A | 1/1985 | Sheng et al. | |
| 4,514,582 A | 4/1985 | Tiedje et al. | |

(Continued)

FOREIGN PATENT DOCUMENTS

| | | |
|---|---|---|
| AU | 3666484 | 6/1985 |
| GB | 2030766 | 4/1980 |

(Continued)

OTHER PUBLICATIONS

Berger, Michael; Moth Eyes Inspire Self-Cleaning Antireflection Nanotechnology Coatings; 2008; 3 pages; Nanowerk LLC.

(Continued)

*Primary Examiner* — Fernando L Toledo
*Assistant Examiner* — Robert Bachner
(74) *Attorney, Agent, or Firm* — Thorpe North & Western LLP

(57) ABSTRACT

Photosensitive devices and associated methods are provided. In one aspect, for example, a photosensitive imager device can include a semiconductor substrate having multiple doped regions forming at least one junction, a textured region coupled to the semiconductor substrate and positioned to interact with electromagnetic radiation, and an electrical transfer element coupled to the semiconductor substrate and operable to transfer an electrical signal from the at least one junction. In one aspect, the textured region is operable to facilitate generation of an electrical signal from the detection of infrared electromagnetic radiation. In another aspect, interacting with electromagnetic radiation further includes increasing the semiconductor substrate's effective absorption wavelength as compared to a semiconductor substrate lacking a textured region.

26 Claims, 14 Drawing Sheets

(56) References Cited

U.S. PATENT DOCUMENTS

| | | |
|---|---|---|
| 4,536,608 A | 8/1985 | Sheng et al. |
| 4,663,188 A * | 5/1987 | Kane ................................ 427/74 |
| 4,829,013 A | 5/1989 | Yamazaki |
| 4,965,784 A | 10/1990 | Land et al. |
| 5,080,725 A | 1/1992 | Green et al. |
| 5,081,049 A | 1/1992 | Green et al. |
| 5,100,478 A | 3/1992 | Kawabata |
| 5,114,876 A | 5/1992 | Weiner |
| 5,164,324 A | 11/1992 | Russell et al. |
| 5,234,790 A | 8/1993 | Lang et al. |
| 5,244,817 A | 9/1993 | Hawkins et al. |
| 5,322,988 A | 6/1994 | Russell et al. |
| 5,346,850 A | 9/1994 | Kaschmitter et al. |
| 5,373,182 A | 12/1994 | Norton |
| 5,578,858 A | 11/1996 | Mueller et al. |
| 5,597,621 A | 1/1997 | Hummel et al. |
| 5,640,013 A | 6/1997 | Ishikawa et al. |
| 5,714,404 A | 2/1998 | Mitlitsky et al. |
| 5,731,213 A | 3/1998 | Ono |
| 5,773,820 A | 6/1998 | Osajda et al. |
| 5,792,280 A | 8/1998 | Ruby et al. |
| 5,977,603 A | 11/1999 | Ishikawa |
| 6,080,988 A | 6/2000 | Ishizuya et al. |
| 6,097,031 A | 8/2000 | Cole |
| 6,147,297 A | 11/2000 | Wettling et al. |
| 6,168,965 B1 | 1/2001 | Malinovich et al. |
| 6,194,722 B1 | 2/2001 | Fiorini et al. |
| 6,372,611 B1 | 4/2002 | Horikawa |
| 6,379,979 B1 | 4/2002 | Connolly |
| 6,420,706 B1 | 7/2002 | Lurie et al. |
| 6,429,036 B1 | 8/2002 | Nixon et al. |
| 6,465,860 B2 | 10/2002 | Shigenaka et al. |
| 6,475,839 B2 | 11/2002 | Zhang et al. |
| 6,580,053 B1 | 6/2003 | Voutsas |
| 6,583,936 B1 | 6/2003 | Kaminsky et al. |
| 6,667,528 B2 | 12/2003 | Cohen et al. |
| 6,677,656 B2 * | 1/2004 | François ........................ 257/462 |
| 6,683,326 B2 | 1/2004 | Iguchi et al. |
| 6,759,262 B2 | 7/2004 | Theil et al. |
| 6,790,701 B2 | 9/2004 | Shigenaka et al. |
| 6,800,541 B2 | 10/2004 | Okumura |
| 6,825,057 B1 | 11/2004 | Heyers et al. |
| 6,927,432 B2 | 8/2005 | Holm et al. |
| 6,984,816 B2 | 1/2006 | Holm et al. |
| 7,057,256 B2 | 6/2006 | Carey, III et al. |
| 7,091,411 B2 | 8/2006 | Falk et al. |
| 7,109,517 B2 | 9/2006 | Zaidi |
| 7,132,724 B1 | 11/2006 | Merrill |
| 7,235,812 B2 | 6/2007 | Chu et al. |
| 7,247,527 B2 | 7/2007 | Shimomura et al. |
| 7,256,102 B2 | 8/2007 | Nakata et al. |
| 7,285,482 B2 | 10/2007 | Ochi |
| 7,314,832 B2 | 1/2008 | Kountz et al. |
| 7,354,792 B2 | 4/2008 | Carey, III et al. |
| 7,390,689 B2 * | 6/2008 | Mazur et al. .................... 438/71 |
| 7,442,629 B2 | 10/2008 | Mazur et al. |
| 7,446,359 B2 | 11/2008 | Lee et al. |
| 7,456,452 B2 | 11/2008 | Wells et al. |
| 7,482,532 B2 | 1/2009 | Yi et al. |
| 7,498,650 B2 | 3/2009 | Lauxtermann |
| 7,504,325 B2 | 3/2009 | Koezuka et al. |
| 7,504,702 B2 | 3/2009 | Mazur et al. |
| 7,511,750 B2 | 3/2009 | Murakami |
| 7,592,593 B2 | 9/2009 | Kauffman et al. |
| 7,629,582 B2 | 12/2009 | Hoffman et al. |
| 7,648,851 B2 | 1/2010 | Fu et al. |
| 7,741,666 B2 | 6/2010 | Nozaki et al. |
| 7,745,901 B1 | 6/2010 | McCaffrey et al. |
| 7,781,856 B2 | 8/2010 | Mazur et al. |
| 7,800,192 B2 | 9/2010 | Venezia et al. |
| 7,816,220 B2 | 10/2010 | Mazur et al. |
| 7,847,253 B2 | 12/2010 | Carey et al. |
| 7,847,326 B2 | 12/2010 | Park et al. |
| 7,875,948 B2 | 1/2011 | Hynecek et al. |
| 7,884,439 B2 | 2/2011 | Mazur et al. |
| 7,884,446 B2 | 2/2011 | Mazur et al. |
| 8,030,726 B2 | 10/2011 | Sumi |
| 8,058,615 B2 | 11/2011 | McCaffrey et al. |
| 8,164,126 B2 | 4/2012 | Moon et al. |
| 8,207,051 B2 | 6/2012 | Sickler et al. |
| 8,476,681 B2 | 7/2013 | Haddad et al. |
| 2002/0056845 A1 | 5/2002 | Iguchi et al. |
| 2002/0148964 A1 | 10/2002 | Dausch et al. |
| 2003/0029495 A1 | 2/2003 | Mazur et al. |
| 2004/0222187 A1 | 11/2004 | Lin |
| 2005/0127401 A1 | 6/2005 | Mazur et al. |
| 2005/0211996 A1 | 9/2005 | Krishna et al. |
| 2005/0227390 A1 | 10/2005 | Shtein et al. |
| 2006/0006482 A1 | 1/2006 | Rieve et al. |
| 2006/0011955 A1 | 1/2006 | Baggenstoss |
| 2006/0079062 A1 | 4/2006 | Mazur et al. |
| 2006/0118781 A1 | 6/2006 | Rhodes |
| 2006/0132633 A1 | 6/2006 | Nam et al. |
| 2006/0138396 A1 | 6/2006 | Lin et al. |
| 2006/0145148 A1 | 7/2006 | Hirai et al. |
| 2006/0145176 A1 | 7/2006 | Lee |
| 2006/0180885 A1 | 8/2006 | Rhodes |
| 2006/0181627 A1 | 8/2006 | Farrier |
| 2006/0231914 A1 | 10/2006 | Carey, III et al. |
| 2006/0244090 A1 | 11/2006 | Roy et al. |
| 2007/0035849 A1 * | 2/2007 | Li et al. .......................... 359/652 |
| 2007/0052050 A1 | 3/2007 | Dierickx |
| 2007/0145505 A1 | 6/2007 | Kim et al. |
| 2007/0178672 A1 | 8/2007 | Tanaka et al. |
| 2008/0026550 A1 | 1/2008 | Werner et al. |
| 2008/0044943 A1 | 2/2008 | Mazur et al. |
| 2008/0076240 A1 | 3/2008 | Veschetti et al. |
| 2008/0099804 A1 | 5/2008 | Venezia et al. |
| 2008/0178932 A1 | 7/2008 | Den Boer et al. |
| 2008/0258604 A1 | 10/2008 | Mazur et al. |
| 2009/0065051 A1 | 3/2009 | Chan et al. |
| 2009/0142879 A1 | 6/2009 | Isaka et al. |
| 2009/0160983 A1 | 6/2009 | Lenchenkov |
| 2009/0194671 A1 | 8/2009 | Nozaki et al. |
| 2009/0200586 A1 | 8/2009 | Mao et al. |
| 2009/0200631 A1 | 8/2009 | Tai et al. |
| 2009/0213883 A1 | 8/2009 | Mazur et al. |
| 2010/0013039 A1 | 1/2010 | Qian et al. |
| 2010/0037952 A1 | 2/2010 | Lin |
| 2010/0052088 A1 | 3/2010 | Carey |
| 2010/0055887 A1 | 3/2010 | Piwczyk |
| 2010/0059385 A1 | 3/2010 | Li |
| 2010/0072349 A1 | 3/2010 | Veeder |
| 2010/0074396 A1 | 3/2010 | Schmand et al. |
| 2010/0096718 A1 | 4/2010 | Hynecek et al. |
| 2010/0097609 A1 | 4/2010 | Jaeger et al. |
| 2010/0143744 A1 | 6/2010 | Gupta et al. |
| 2010/0219506 A1 | 9/2010 | Gupta et al. |
| 2010/0224229 A1 | 9/2010 | Pralle et al. |
| 2010/0240169 A1 | 9/2010 | Petti et al. |
| 2010/0264473 A1 | 10/2010 | Adkisson et al. |
| 2010/0290668 A1 | 11/2010 | Friedman et al. |
| 2010/0300505 A1 | 12/2010 | Chen |
| 2011/0073976 A1 | 3/2011 | Vaillant |
| 2011/0220971 A1 | 9/2011 | Hadda |
| 2011/0227138 A1 | 9/2011 | Hadda |
| 2011/0266644 A1 | 11/2011 | Yamamura et al. |
| 2011/0303999 A1 | 12/2011 | Sakamoto et al. |
| 2012/0024363 A1 | 2/2012 | Carey et al. |
| 2012/0024364 A1 | 2/2012 | Carey, III et al. |
| 2012/0111396 A1 | 5/2012 | Saylor et al. |
| 2012/0171804 A1 | 7/2012 | Moslehi et al. |
| 2012/0313204 A1 | 12/2012 | Haddad et al. |
| 2012/0313205 A1 | 12/2012 | Haddad et al. |
| 2013/0082343 A1 | 4/2013 | Fudaba et al. |

FOREIGN PATENT DOCUMENTS

| | | |
|---|---|---|
| JP | 63116421 | 5/1988 |
| JP | 2152226 | 6/1990 |
| JP | 07/173484 | 7/1995 |
| JP | 9298308 | 11/1997 |
| JP | 2001/339057 | 12/2001 |
| JP | 2008/187003 | 8/2008 |

(56) References Cited

FOREIGN PATENT DOCUMENTS

| JP | 2010/278472 | 12/2010 |
|---|---|---|
| KR | 2001/0061058 | 4/2001 |
| KR | 2010/0118864 | 11/2010 |
| WO | WO 2006/086014 | 8/2006 |
| WO | WO 2009/100023 | 8/2009 |
| WO | WO 2011/035188 | 3/2011 |

OTHER PUBLICATIONS

Boden, S.A. et al.; Nanoimprinting for Antireflective Moth-Eye Surfaces; 4 pages; 2008.
Dewan, Rahul et al.; Light Trapping in Thin-Film Silicon Solar Cells with Submicron Surface Texture; Optics Express; vol. 17, No. 25; Dec. 7, 2009; Optical Society of America.
Dobrzanski, L.A. et al.; Laser Surface Treatment of Multicrystalline Silicon for Enhancing Optical Properties; Journal of Materials Processing Technology; p. 291-296; 2007; Elsevier B.V.
Gjessing, J. et al.; 2D back-side diffraction grating for impored light trapping in thin silicon solar cells; Optics Express; vol. 18, No. 6; pp. 5481-5495; Mar. 15, 2010; Optical Society of America.
Gjessing, J. et al.; 2D blazed grating for light trapping in thin silicon solar cells; 3 pages; 2010; Optical Society of America.
Hermann, S. et al.; Impact of Surface Topography and Laser Pulse Duration for Laser Ablation of Solar Cell Front Side Passivating SiNx Layers; Journal of Applied Physics; vol. 108, No. 11; pp. 114514-1-114514-8; 2010; American Institute of Physics.
Joy, T. et al.; Development of a Production-Ready, Back-Illuminated CMOS Image Sensor with Small Pixels; Electron Devices Meeting; pp. 1007-1010; 2007; IEEE.
Kray, D. et al.; Laser-doped Silicon Soalr Cells by Laser Chemical Processing (LCP) exceeding 20% Efficiency; 33rd IEEE Photovoltaic Specialist Conference; 3 pages; May 2008; IEEE.
Lin, A. et al.; Optimization of Random Diffraction Gratings in Thin-Film Solar Cells Using Genetic Algorithms; 2007; 1 page; SSEL Annual Report.
Mateus; C.F.R. et al.; Ultrabroadband Mirror Using Low-Index Cladded Subwavelength Grating; Photonics Technology Letters; vol. 16, Issue No. 2; pp. 518-520; Feb. 2004; IEEE.
Matsuno, Shigeru et al.; Advanced Technologies for High Efficiency Photovoltaic Systems; Mitsubishi Electric Advance; vol. 122; pp. 17-19; Jun. 2008.
Moloney, A.M. et al.; Novel Black Silicon PIN Photodiodes; 8 pages; Jan. 25, 2006; SPIE.
Munday, J.N. et al.; Large Integrated Absorption Enhancement in Plasmonic Solar Cells by Combining Metallic Gratings and Antireflection Coatings; Nano Letters; vol. 11, No. 6; pp. 2195-2201; Oct. 14, 2010; American Chemical Society.
Payne, D.N.R. et al.; Characterization of Experimental Textured ZnO:Al Films for Thin Film Solar Cell Applications and Comparison with Commercial and Plasmonic Alternatives; Photovoltaic Specialists Conference (PVSC); pp. 1560-1564; 2010; IEEE.
PCT Application PCT/US2010/049375; filed Sep. 17, 2010; Search Report mailed Apr. 28, 2011.
Sai, H. et al.; Enhancement of Light Trapping in Thin-Film Hydrogenated Microcrystalline Si Solar Cells Using Back Reflectors with Self-Ordered Dimple Pattern; Applied Physics Letters; vol. 93; 2008; American Institute of Physics.
Senoussaoui, N. et al.; Thin-Film Solar Cells with Periodic Grating Coupler; Thin Solid Films; pp. 397-401; 2003; Elsevier B.V.
Szlufcik, J. et al.; Simple Integral Screenprinting process for selective emitter polycrystalline silicon solar cells; Applied Physics Letters; vol. 59, No. 13; Sep. 23, 1991; American Institute of Physics.
Yamamoto, K. et al.; NIR Sensitivity Enhancement by Laser Treatment for Si Detectors; Nuclear Instruments and Methods in Physics Research A; pp. 520-523; Mar. 31, 2010; Elsevier.
Yan, B.; Light Trapping Effect from Randomized Textures of Ag/ZnO Back Reflector on Hyrdrogenated Amorphous and Nanocrystalline Silicon Based Solar Cells; Thin Film Solar Technology II; vol. 7771; 2010; SPIE.
Zaidi, S.H. et al.; Diffraction Grating Structures in Solar Cells; Photovoltaic Specialists Conference, 2000; 4 pages; Sep. 2000; IEEE.
Tull; Femtosecond Laser Ablation of Silicon: Nanoparticles, Doping and Photovoltaics; Jun. 2007; 174 pages.
Carry; Femtosecond-laser Microstructuring of Silicon for Novel Optoelectronic Devices; Jul. 2004; 162 pages.
Nayak; Efficient light trapping in silicon solar cells by ultrafast-laser-induced self-assembled micro/nano structures; Progress in Photovoltaics: Research and Applications; 2011; 9 pages; John Wiley & Sons, Ltd.
Cotter, Jeffrey E.; Optical intensity of light in layers of silicon with rear diffuse reflectors; Journal of Applied Physics; Jul. 1, 1998; pp. 618-624; vol. 84, No. 1; American Institute of Physics.
Dulinski, Wojciech et al.; Tests of backside illumincated monolithic CMOS pixel sensor in an HPD set-up; Nuclear Instruments and methods in Physics Research; Apr. 19, 2005; pp. 274-280; Elsevier B.V.
Hüpkes, J. et al.; Light Scattering and Trapping in Different Thin Film Photovoltaic Devices; 24th European Photovoltaic Solar Energy Conference, Hamburg, Germany (Sep. 21-25, 2009); pp. 2766-2769.
Li, Hongsong et al.; An experimental study of the correlation between surface roughness and light scattering for rough metallic surfaces; Advanced Characterization Techniques for Optics, Semiconductors, and Nanotechnologies II; 2005; pp. 25780V-1-25780V-15; vol. 5878; SPIE Bellingham, WA.
Pain, Bedabrata et al.; A back-illuminated megapixel CMOS image sensor; http://hdl.handle.net/2014/39312; May 1, 2005.
Pain, Bedabrata; Backside Illumination Technology for SOI-CMOS Image Sensors; 2009 IISW Symposium on Backside Illujination of Solid-State Image Sensors, Bergen Norway; Jun. 25, 2009; pp. 1-23.
Tower, John R. et al.; Large Format Backside Illuminated CCD Imager for Space Surveillance; IEEE Transactions on Electron Devices, vol. 50, No. 1; Jan. 2003; pp. 218-224.
Winderbaum, S. et al.; Reactive ion etching (RIE) as a method for texturing polycrystalline silicon solar cells; Solar Energy Materials and Solar Cells; 1997; pp. 239-248; Elsevier Science B.V.
Buttgen, B.; "Demodulation Pixel Based on Static Drift Fields"; IEEE Transactions on Electron Devices, vol. 53, No. 11, Nov. 2006.
Carey et al., "Femtosecond-Laser-Assisted Microstructuring of Silicon Surfaces", Optics and Photonics News, 2003. 14, 32-36.
Carey, et al. "Femtosecond Laser-Assisted Microstructuring of Silicon for Novel Detector, Sensing and Display Technologies", LEOS 2003, 481-482, Tuscon, AR.
Carey, et al. "Femtosecond Laser-Assisted Microstructuring of Silicon for Novel Detector, Sensing and Display Technologies", LEOS; 2002, 97-98, Glasgos, Scotland, 2002.
Carey, et al., "Fabrication of Micrometer-Sized Conical Field Emitters Using Femtosecond Laser-Assisted Etching of Silicon," Proc. IVMC 2001, 75-76, UC Davis, Davis, CA.
Carey, et al., "Field Emission from Silicon. Microstructures Formed by Femtosecond Laser Assisted Etching," Proc. CLEO 2001 (Baltimore, MD 2001) 555-557.
Carey, et al., "High Sensitivity Silicon-Based VIS/NIR Photodetectors", Optical Society of America (2003) 1-2.
Carey, J.E. PhD Thesis Harvard University, pp. 86-116, 2004.
Chen, Q. et al.; Broadband moth-eye antireflection coatings fabricated by low-cost nanoimprinting; Applied Physics Letters 94; pp. 263118-1-263118-3; 2009; American Institute of Physics.
Chien et al, "Pulse Width Effect in Ultrafast Laser Processing of Materials," Applied Physics A, 2005, 1257-1263, 81, Springer Berlin, Heidelberg, Germany.
Crouch et al., "Comparison of Structure and Properties of Femtosecond and Nanosecond Laser-Structured Silicon" Appl. Phys. Lett., 2004, 84, 1850-1852.
Crouch et al., "Infrared Absorption by Sulfur-Doped Silicon Formed by Femtosecond Laser Irradiation", Appl. Phys. A, 2004, 79, 1635-1641.
Despeisse, et al.; "Thin Film Silicon Solar Cell on Highly Textured Substrates for High Conversion Efficiency"; 2004.
Dobie, et al.; "Minimization of reflected light in photovoltaic modules"; Mar. 1, 2009.

(56) References Cited

OTHER PUBLICATIONS

Duerinckx, et al.; "Optical Path Length Enhancement for >13% Screenprinted Thin Film Silicon Solar Cells"; 2006.
Dolgaev et al., "Formation of Conical Microstructures Upon Laser Evaporation of Solids", Appl. Phys. A, 2001, 73, 177-181.
Forbes; "Texturing, reflectivity, diffuse scattering and light trapping in silicon solar cells"; 2012.
Fowlkes et al., "Surface Microstructuring and Long-Range Ordering of Silicon Nanoparticles", Appl. Phys. Lett., 2002, 80 (20), 3799-3801.
Goetzberger, et al.; "Solar Energy Materials & Solar Cells"; vol. 92 (2008) pp. 1570-1578.
Haug, et al.; "Light Trapping effects in thin film silicon solar cells"; 2009.
Her et al., "Microstructuring of Silicon with Femtosecond Laser Pulses," Applied Physics Letters, 1998, 1673-1675, vol. 73, No. 12, American Institute of Physics.
Her et al., "Novel Conical Microstructures Created in Silicon With Femtosecond Laser Pulses", CLEO 1998, 511-512, San Francisco, CA.
Her, et al., "Femtosecond laser-induced formation of spikes on silicon," Applied Physics A, 2000, 70, 383-385.
Huang, et al.; "Microstructured silicon photodetector"; Applied Physics Letters 89, 033506; 2006 American Institute of Physics; 2000.
Kim et al.; "Strong Sub-Band-Gap Infrared Absorption in Silicon Supersaturated with Sulfur"; 2006 Appl. Phys. Lett. 88, 241902-1-241902-3.
Kroning et al.; X-ray Imaging Systems for NDT and General Applications; 2002; Fraunhofer Institute for Nondestructive Testing; Saarbrucken and Dresden, Germany.
Madzhaov, et al.; "Light trapping in thin-firm silicon solar cells for superstrate and substrate configuration" Abstract #1614, $218^{th}$ ECS Meeting © 2010 the Electrochemical Society.
Nayak et al, "Semiconductor Laesr Crystallization of a—Si:H," SPIE Digital Library, 2003, 277-380, vol. 4977, Bellingham, Washington. 2003.
Nayak et al, "Semiconductor Laser Crystallization of a—Si:H on Conducting Tin-Oxide-Coated Glass for Solar Cell and Display Applications," Applied Physics A, 2005, 1077-1080, 80, Springer Berlin, Heidelberg, Germany.
Nayak, B.K. et al.; Ultrafast Laser Textured Silicon Solar Cells; Mater. Res. Soc. Symp. Proc.; vol. 1123; 6 pages; 2009; Materials Research Society.
Pedraza et al., "Silicon Microcolumn Arrays Grown by Nanosecond Pulsed-Excimer Laser Irradiation", Appl. Phys. Lett., 1999, 74 (16), 2322-2324, American Institute of Physics.
Pedraza et al., "Surface Nanostructuring of Silicon", Appl. Phys. A, 2003, 77, 277-284.
Russell, et al.; "Nanosecond Eximer Laser Processing for Novel Microelectronic Fabrication"; Nanosecond Excimer Laser Processing; 6 pages; 1989.
Sanchez et al., "Dynamics of the Hydrodynamical Growth of Columns on Silicon Exposed to ArF Excimer-Laser Irradiation", Appl. Phys. A, 1998, 66, 83-86.
Sanchez et al., "Whiskerlike Structure Growth on Silicon Exposed to ArF Excimer Laser Irradiation", Appl. Phys. Lett., 1996, 69 (5), 620-622.
Sarnet et al.; "Femtosecond laser for black silicon and photovoltaic cells"; Feb. 21, 2008, Proc. Of SPIE; vol. 6881; pags 1-15.
Shen et al., "Formation of Regular Arrays of Silicon Micorspikes by Femotsecond Laser Irradiation Through a Mask", Appl. Phys. Lett., 82, 1715-1717 (2003).
Solar Energy Research Institute, "Basic Photovoltaic Principles and Methods," Van Nostrand Reinhold Co., NY 1984, pp. 45-47 and 138-142.
Tabbal et al., "Formation of Single Crystal Sulfur Supersaturated Silicon Based Junctions by Pulsed Laser Melting". 2007, J. Vac. Sci. Technol. B25(6), 1847-1852.
Wu et al., "Black Silicon: A New Light Absorber," APS Centennial Meeting (Mar. 23, 1999).
Wu et al., "Femtosecond laser-gas-solid interactions," Thesis presented to the Department of Physics at Harvard University, pp. 1-113, 126-136, Aug. 2000.
Wu et al., "Visible Luminescence From Silicon Surfaces Microstructured in Air". Appl. Phys. Lett., vol. 81, No. 11, 1999-2001 (2002).
Wu, et al, "Near-Unity Below-Band-Gap Absorption by Microstructured Silicon," 2001, Applied Physics Letters, 1850-1852, vol. 78, No. 13, American Institute of Physics.
Yablonovitch, et al.; "Intensity Enhancement in Textured Optical Sheets for Solar Cells"; © 1982 IEEE.
Younkin et al., "Infrared Absorption by Conical Silicon Microstructures Made in a Variety of Background Gases Using Femtosecond-Laser Pulses", J. Appl. Phys., 93, 2626-2629 (2003).
Younkin, "Surface Studies and Microstructure Fabrication Using Femtosecond Laser Pulses," Thesis presented to the Division of Engineering & Applied sciences at Harvard University (Aug. 2001).
Yuan, et al.; "Efficient black silicon solar cell with a density-graded nanoporous surface: Optical properties, performance limitations, and design rules"; American Institute of Physics; Applied Physics Letters 95. 1230501 (2009) 3 pages.

* cited by examiner

PHOTOSENSITIVE IMAGING DEVICES AND ASSOCIATED METHODS

PRIORITY DATA

This application claims the benefit of U.S. Provisional Patent Application Ser. No. 61/243,434, filed on Sep. 17, 2009, U.S. Provisional Patent Application Ser. No. 61/311,004 filed on Mar. 5, 2010, and U.S. Provisional Patent Application Ser. No. 61/311,107, filed on Mar. 5, 2010, each of which is incorporated herein by reference.

BACKGROUND

The interaction of light with semiconductor materials has been a significant innovation. Silicon imaging devices are used in various technologies, such as digital cameras, optical mice, video cameras, cell phones, and the like. Charge-coupled devices (CCDs) were widely used in digital imaging, and were later improved upon by complementary metal-oxide-semiconductor (CMOS) imagers having increased performance. CMOS sensors are typically manufactured from silicon and can covert visible incident light into a photocurrent and ultimately into a digital image. Silicon-based technologies for detecting infrared incident electromagnetic radiation have been problematic, however, because silicon is an indirect bandgap semiconductor having a bandgap of about 1.1 eV. Thus the absorption of electromagnetic radiation having wavelengths of greater than about 1100 nm is, therefore, very low in silicon.

SUMMARY

The present disclosure provides photosensitive devices and associated methods. In one aspect, for example, a photosensitive imager device can include a semiconductor substrate having multiple doped regions forming at least one junction, a textured region coupled to the semiconductor substrate and positioned to interact with electromagnetic radiation, and an electrical transfer element coupled to the semiconductor substrate and operable to transfer an electrical signal from the at least one junction. In one aspect, the textured region is operable to facilitate generation of an electrical signal from the detection of infrared electromagnetic radiation. In another aspect, interacting with electromagnetic radiation further includes increasing the semiconductor substrate's effective absorption length as compared to a semiconductor substrate lacking a textured region. In one specific aspect, the transfer element is selected from the group consisting of a transistor, a sensing node, a transfer gate, and combinations thereof.

The textured region can be positioned in a variety of locations relative to the doped regions. In one aspect, for example, the textured region is positioned on a surface of the semiconductor substrate that is opposite the multiple doped regions. In one specific aspect, the textured region has a surface morphology operable to direct electromagnetic radiation into or out of the semiconductor substrate. The surface morphology of the textured region relative to the semiconductor substrate can include a variety of configurations, including, without limitation, sloping, pyramidal, inverted pyramidal, spherical, parabolic, asymmetric, symmetric, and the like, including combinations thereof.

In another aspect, the textured region can be positioned on a surface of the semiconductor substrate that is adjacent the multiple doped regions. In a more specific aspect, an additional textured region can be positioned on a surface of the semiconductor substrate that is opposite the multiple doped regions. In this manner, textured regions can thus be positioned adjacent to multiple doped regions and opposite the multiple doped regions.

Various aspects of the textured region can vary depending on the desired configuration of the device. In one aspect, however, the textured region includes surface features having a size selected from the group consisting of micron-sized, nano-sized, and combinations thereof. Numerous surface feature morphologies are contemplated, nonlimiting examples of which include cones, pillars, pyramids, micolenses, quantum dots, inverted features, and combinations thereof. Additionally, the textured region can be formed by a variety of processes. Nonlimiting examples of such texturing processes can include lasing, chemical etching (e.g. anisotropic etching, isotropic etching), nanoimprinting, material deposition, and combinations thereof.

Additional layers and/or structures can be included in various devices according to aspects present disclosure. In one aspect, for example, a reflective layer can be coupled to the semiconductor substrate and positioned to maintain the electromagnetic radiation in the semiconductor substrate. In another aspect, a lens can be optically coupled to the semiconductor substrate and positioned to focus incident electromagnetic radiation into the semiconductor substrate.

In another aspect of the present disclosure, a method of making a photosensitive imager device is provided. Such a method can include forming a textured region on a semiconductor substrate having multiple doped regions forming a least one junction, wherein the textured region is formed in a position to interact with electromagnetic radiation and coupling an electrical transfer element to the semiconductor substrate such that the electrical transfer element is operable to transfer an electrical signal from the at least one junction.

In one aspect, the photosensitive imager device can be tuned to be selected to filter out specific electromagnetic radiation wavelengths. In one specific aspect, tuning includes forming surface features to have dimensions that selectively diffuse or selectively absorb a desired wavelength of electromagnetic radiation. In another aspect, tuning is accomplished through a factor selected from the group consisting of placement of the textured region, material type and/or thickness of the textured region, dopant type of the textured region, doping profile of the texture region, dopant profile of the semiconductor substrate, material type and/or thickness of the semiconductor substrate, and combinations thereof.

In another aspect of the present disclosure, a photosensitive imager device is provided. Such a device can include a semiconductor substrate having multiple doped regions forming a least one junction, a textured region coupled to the semiconductor substrate and positioned to interact with electromagnetic radiation, and at least 4 transistors coupled to the semiconductor substrate and with at least one of the transistors electrically coupled to the at least one junction.

DETAILED DESCRIPTION

Figure 1:
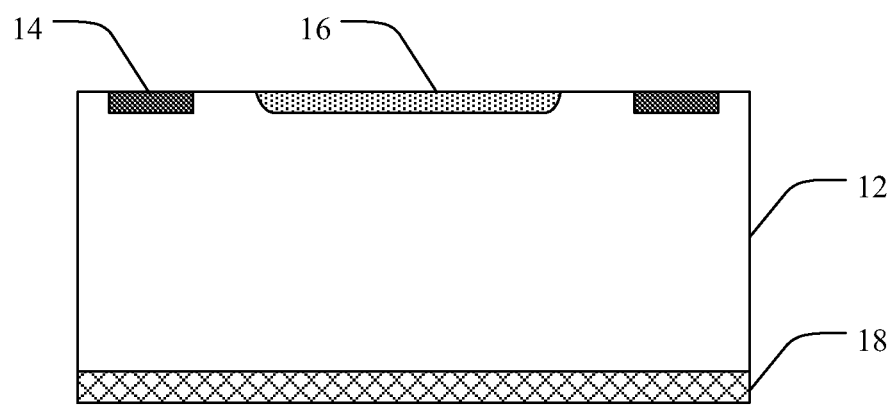
FIG. 1 is a schematic view of a photosensitive device in accordance with one aspect of the present disclosure.

Before the present disclosure is described herein, it is to be understood that this disclosure is not limited to the particular structures, process steps, or materials disclosed herein, but is extended to equivalents thereof as would be recognized by those ordinarily skilled in the relevant arts. It should also be understood that terminology employed herein is used for the purpose of describing particular embodiments only and is not intended to be limiting.

Definitions

The following terminology will be used in accordance with the definitions set forth below.

It should be noted that, as used in this specification and the appended claims, the singular forms "a," and, "the" include plural referents unless the context clearly dictates otherwise. Thus, for example, reference to "a dopant" includes one or more of such dopants and reference to "the layer" includes reference to one or more of such layers.

As used herein, the term "low oxygen content" refers to any material having an interstitial oxygen content that is less than or equal to about 60 ppm atomic.

As used herein, the terms "disordered surface" and "textured surface" can be used interchangeably, and refer to a surface having a topology with nano- to micron-sized surface variations formed by the irradiation of laser pulses. While the characteristics of such a surface can be variable depending on the materials and techniques employed, in one aspect such a surface can be several hundred nanometers thick and made up of nanocrystallites (e.g. from about 10 to about 50 nanometers) and nanopores. In another aspect, such a surface can include micron-sized structures (e.g. about 2 µm to about 60 µm). In yet another aspect, the surface can include nano-sized and/or micron-sized structures from about 5 nm and about 500 µm.

As used herein, the term "fluence" refers to the amount of energy from a single pulse of laser radiation that passes through a unit area. In other words, "fluence" can be described as the energy density of one laser pulse.

As used herein, the terms "surface modifying" and "surface modification" refer to the altering of a surface of a semiconductor material using laser radiation. In one specific aspect, surface modification can include processes using primarily laser radiation or laser radiation in combination with a dopant, whereby the laser radiation facilitates the incorporation of the dopant into a surface of the semiconductor material. Accordingly, in one aspect surface modification includes doping of a semiconductor material.

As used herein, the term "target region" refers to an area of a semiconductor material that is intended to be doped or surface modified using laser radiation. The target region of a semiconductor material can vary as the surface modifying process progresses. For example, after a first target region is doped or surface modified, a second target region may be selected on the same semiconductor material.

As used herein, the term "detection" refers to the sensing, absorption, and/or collection of electromagnetic radiation.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

The Disclosure

Electromagnetic radiation can be present across a broad wavelength range, including visible range wavelengths (approximately 350 nm to 800 nm) and non-visible wavelengths (longer than about 800 nm or shorter than 350 nm). The infrared spectrum is often described as including a near infrared portion of the spectrum including wavelengths of approximately 800 to 1300 nm, a short wave infrared portion of the spectrum including wavelengths of approximately 1300 nm to 3 micrometers, and a mid to long wave infrared (or thermal infrared) portion of the spectrum including wavelengths greater than about 3 micrometers up to about 30 micrometers. These are generally and collectively referred to herein as "infrared" portions of the electromagnetic spectrum unless otherwise noted.

Traditional silicon photodetecting imagers have limited light absorption/detection properties. For example, infrared light is mostly transparent to such silicon based detectors. While other materials (e.g. InGaAs) can be used to detect infrared electromagnetic radiation having wavelengths greater than about 1000 nm, silicon is still commonly used because it is relatively cheap to manufacture and can be used to detect wavelengths in the visible spectrum (i.e. visible light, 350 nm-800 nm). Traditional silicon materials require substantial absorption depths to detect photons having wavelengths longer than approximately 700 nm. While visible light can be absorbed at relatively shallow depths in silicon, absorption of longer wavelengths (e.g. 900 nm) in silicon of a standard wafer depth (e.g. approximately 750 µm) is poor if at all. The devices of the present disclosure increase the absorption of semiconductor materials by decreasing the effective absorption length to longer wavelengths as compared to traditional materials. For example, the absorption depth of silicon can be reduced such that these longer wavelengths can be absorbed at depths of less than or equal to about 850 µm. In other words, by decreasing the effective absorption length these devices are able to absorb longer wavelengths (e.g. >1000 nm for silicon) within a thin semiconductor material. In addition to increasing the effective absorption length, the response rate or response speed can also be increased using thinner semiconductor materials.

The present disclosure additionally provides broadband photosensitive diodes, pixels, and imagers capable of detecting visible as well as infrared electromagnetic radiation, including associated methods of making such devices. A photosensitive diode can include a semiconductor substrate having multiple doped regions forming at least one junction, and at least one textured region coupled to the semiconductor substrate and positioned to interact with electromagnetic radiation. In one aspect the multiple doped regions can include at least one cathode region and at least one anode region. In some aspects, doped regions can include an n-type dopant and/or a p-type dopant as is discussed below, thereby creating a p-n junction. In other aspects, a photosensitive device can include an i-type region to form a p-i-n junction.

A photosensitive pixel can include a semiconductor substrate having multiple doped regions forming at least one junction, at least one textured region coupled to the semiconductor substrate and positioned to interact with electromagnetic radiation, and an electrical transfer element coupled to the semiconductor substrate and operable to transfer an electrical signal from the at least one junction. A photosensitive imager can include multiple photosensitive pixels. Additionally, an electrical transfer element can include a variety of devices, including without limitation, transistors, sensing nodes, transfer gates, transfer electrodes, and the like.

Photosensitive or photodetecting imagers include photodiodes or pixels that are capable of absorbing electromagnetic radiation within a given wavelength range. Such imagers can be passive pixel sensors (PPS), active pixel sensors (APS), digital pixel sensor imagers (DPS), or the like, with one difference being the image sensor read out architecture. For example, a semiconducting photosensitive imager can be a three or four transistor active pixel sensor (3T APS or 4T APS). Various additional components are also contemplated, and would necessarily vary depending on the particular configuration and intended results. As and example, a 4T configuration can additionally include, among other things, a transfer gate, a reset, a source follower, and row select transistors. Additionally, devices having greater than 4 transistors are also within the present scope.

Photosensitive imagers can be front side illumination (FSI) or back side illumination (BSI) devices, and there are advantages and disadvantages to both architecture types. In a typical FSI imager, incident light enters the semiconductor device by first passing by transistors and metal circuitry. The light, however, can scatter off of the transistors and circuitry prior to entering the light sensing portion of the imager, thus causing optical loss and noise. A lens can be disposed on the topside of a FSI pixel to direct and focus the incident light to the light sensing active region of the device, thus partially avoiding the circuitry. In one aspect the lens can be a ulens. BSI imagers, one the other hand, are configured to have the depletion region of the junction extending to the opposite side of the device. In one aspect, for example, incident light enters the device via the light sensing portion and is mostly absorbed prior to reaching the circuitry. BSI designs allow for smaller pixel architecture and a high fill factor for the imager. As mentioned, the present disclosure can be adapted for either configuration. It should also be understood that devices according to aspects of the present disclosure can be incorporated into complimentary metal-oxide-semiconductor (CMOS) imager architectures or charge-coupled device (CCD) imager architectures.

In one aspect, as is shown in FIG. 1, a photosensitive diode 10 can include a semiconductor substrate 12 having multiple doped regions 14, 16 forming at least one junction, and at least one textured region 18 coupled to the semiconductor substrate and positioned to interact with electromagnetic radiation. The different doped regions can have the same doping profile or different doping profiles, depending on the device. Such an architecture is a FSI design where light enters the semiconductor substrate from the direction of the multiple doped regions. While the device shown in FIG. 1 contains three doped regions, it should be noted that aspects containing one or more doped regions are considered to be within the present scope. Additionally, the semiconductor substrate can be doped, and thus can be considered to be a doped region in some aspects. It should also be noted that the photosensitive diode can be configured with a BSI architecture, and thus electromagnetic radiation would enter the semiconductor substrate from the direction of the textured region.

The various devices according to aspects of the present disclosure can exhibit increased quantum efficiency over traditional photosensitive devices. Any increase in the quantum efficiency makes a large difference in the signal to noise ratio. More complex structures can provide not only increased quantum efficiency but also good uniformity from pixel to pixel. In addition, devices of the present disclosure exhibit increased responsivity as compared to traditional photosensitive devices. For example, in one aspect the responsivity can be greater than or equal to 0.8 A/W for wavelengths greater than 1000 nm for semiconductor substrate that is less than 100 µm thick.

Photosensitive imagers can be maintained under constant conditions (fixed voltage or current) to provide enhanced linearity and uniformity. Connections between the imager and the underlying device layers can be achieved using vias fabricated from a refractory metal, such as tungsten or tantalum. Placing storage elements under the imager may provide various photonic benefits. For example, the entire pixel array may be dedicated to signal processing. This may enable higher performance by permitting access to low level pixel signals. Furthermore, massively parallel operations can be performed by pixel processors. For example, analog to digital conversion, noise reduction (ie., true correlated double sampling), power conditioning, nearest neighbor pixel processing, compression, fusion, and color multiplexing operations can be performed.

A variety of semiconductor materials are contemplated for use with the devices and methods according to aspects of the present disclosure. Non-limiting examples of such semiconductor materials can include group IV materials, compounds and alloys comprised of materials from groups II and VI, compounds and alloys comprised of materials from groups III and V, and combinations thereof. More specifically, exemplary group IV materials can include silicon, carbon (e.g. diamond), germanium, and combinations thereof. Various exemplary combinations of group IV materials can include silicon carbide (SiC) and silicon germanium (SiGe). In one specific aspect, the semiconductor material can be or include silicon. Exemplary silicon materials can include amorphous silicon (a-Si), microcrystalline silicon, multicrystalline silicon, and monocrystalline silicon, as well as other crystal types. In another aspect, the semiconductor material can include at least one of silicon, carbon, germanium, aluminum nitride, gallium nitride, indium gallium arsenide, aluminum gallium arsenide, and combinations thereof.

Exemplary combinations of group II-VI materials can include cadmium selenide (CdSe), cadmium sulfide (CdS), cadmium telluride (CdTe), zinc oxide (ZnO), zinc selenide (ZnSe), zinc sulfide (ZnS), zinc telluride (ZnTe), cadmium zinc telluride (CdZnTe, CZT), mercury cadmium telluride (HgCdTe), mercury zinc telluride (HgZnTe), mercury zinc selenide (HgZnSe), and combinations thereof.

Exemplary combinations of group III-V materials can include aluminum antimonide (AlSb), aluminum arsenide (AlAs), aluminum nitride (AlN), aluminum phosphide (AlP), boron nitride (BN), boron phosphide (BP), boron arsenide (BAs), gallium antimonide (GaSb), gallium arsenide (GaAs), gallium nitride (GaN), gallium phosphide (GaP), indium antimonide (InSb), indium arsenide (InAs), indium nitride (InN), indium phosphide (InP), aluminum gallium arsenide (Al-GaAs, $Al_xGa_{1-x}As$), indium gallium arsenide (InGaAs, $In_xGa_{1-x}As$), indium gallium phosphide (InGaP), aluminum indium arsenide (AlInAs), aluminum indium antimonide (AlInSb), gallium arsenide nitride (GaAsN), gallium arsenide phosphide (GaAsP), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide antimonide (GaInNAsSb), gallium indium arsenide antimonide phosphide (GaInAsSbP), and combinations thereof.

The semiconductor material can be of any thickness that allows electromagnetic radiation detection and conversion functionality, and thus any such thickness of semiconductor material is considered to be within the present scope. In some aspects the laser processed region of the semiconductor increases the efficiency of the device such that the semiconductor material can be thinner than has previously been possible. Decreasing the thickness of the semiconductor reduces the amount of semiconductor material required to make such a device. In one aspect, for example, the semiconductor material has a thickness of from about 500 nm to about 50 µm. In another aspect, the semiconductor material has a thickness of less than or equal to about 500 µm. In yet another aspect, the semiconductor material has a thickness of from about 1 µm to about 10 µm. In a further aspect, the semiconductor material can have a thickness of from about 5 µm to about 750 µm. In yet a further aspect, the semiconductor material can have a thickness of from about 5 µm to about 100 µm.

Additionally, various types of semiconductor material are contemplated, and any such material that can be incorporated into an electromagnetic radiation detection device is considered to be within the present scope. In one aspect, for example, the semiconductor material is monocrystalline. In another aspect, the semiconductor material is multicrystalline. In yet another aspect, the semiconductor material is microcrystalline. It is also contemplated that the semiconductor material can be amorphous. Specific nonlimiting examples include amorphous silicon or amorphous selenium.

The semiconductor materials of the present disclosure can also be made using a variety of manufacturing processes. In some cases the manufacturing procedures can affect the efficiency of the device, and may be taken into account in achieving a desired result. Exemplary manufacturing processes can include Czochralski (Cz) processes, magnetic Czochralski (mCz) processes, Float Zone (FZ) processes, epitaxial growth or deposition processes, and the like. Whether or not low oxygen content is desired in the device can also affect the choice of a manufacturing process for the semiconductor material. Various processes produce semiconductor materials containing varying amounts of oxygen, and as such, some applications having more stringent tolerances with respect to oxygen levels may benefit more from specific manufacturing procedures as compared to others. For example, during CZ crystal growth oxygen from the containment vessel, usually a quartz crucible, can become incorporated into the crystal as it is pulled. Additionally, other sources of oxygen contamination are also possible with the CZ process. Such contamination may be reduced, however, through the use of non oxygen-containing crucible materials, as well as the development of other crystal growth methods that do not utilize a crucible. One such process is the FZ process.

Materials grown with the CZ method can also be made to have lowered oxygen concentration through enhancements to the crystal growth process, such as growing the crystal in the presence of a magnetic field (i.e. the mCz process). Also, gettering techniques can be employed to reduce the impact of oxygen or other impurities on the finished device. These gettering techniques can include thermal cycles to liberate or nucleate impurities, or selective ion implantation of species to serve as gettering sites for the impurities. For example, oxygen concentrated in the semiconductor can be removed by the performing a furnace cycle to form a denuded zone. During heating with an inert gas, oxygen near the surface of the semiconductor diffuses out of the material. During the furnace cycle but after the denuding step, nucleating and growing steps may be performed. Nucleating sites for precipitates are formed during the nucleating step, and the precipitates are grown from the nucleating sites during a growing step. The precipitates are formed from interstitial oxygen within the bulk of the semiconductor material and beneath the denuded zone. The precipitation of oxygen in the bulk of the semiconductor material can be desired because such precipitates can act as gettering sites. Such precipitate formation can also be performed to "lock up" interstitial oxygen into the precipitates and reduce the likelihood that such oxygen can migrates from the bulk of the semiconductor material into the denuded zone.

In those aspects where low oxygen content of the device is desired, further processing of the semiconductor material can be performed so as to minimize the introduction of oxygen. Oxygen can exist in different states or at different sites (for example, interstitially or substitutionally) within a semiconductor such as silicon, dependent upon the thermal processing the semiconductor has received. If the semiconductor is subjected to temperatures higher than, for example, about 1000° C., oxygen can form aggregates or clusters that serve as defect sites in the crystal lattice. These sites may result in trap states and a reduction in carrier lifetime within the semiconductor material and device can occur. At lower temperatures (for example, around 400° C. to 700° C.), oxygen can behave as electrically active thermal donors. Thus, oxygen can have a negative impact on carrier lifetime and on carrier mobility. In a device fabricated to have photoconductive gain, the presence of oxygen causing reduced carrier lifetime may result in reduced levels of photoconductive gain.

It may be beneficial, therefore, to produce semiconductor devices such that a low oxygen content is obtained or maintained. This can be accomplished in a variety of ways, including using semiconductor materials having low levels of oxygen contained therein to begin with, processing these materials in a manner that minimizes the uptake of oxygen into the semiconductor lattice, and utilizing techniques that eliminate or reduce oxygen that may be present in the semiconductor. Such processes and techniques can include, for example, annealing the semiconductor material and any laser treated region to lower temperatures as compared to previous annealing procedures. Annealing processes are discussed more fully below.

Additionally, texture processing of the semiconductor material and/or any annealing process can be performed in a substantially oxygen-depleted environment in order to minimize the introduction of oxygen into the semiconductor. An oxygen-depleted or substantially oxygen-depleted environment can include a variety of environments. In one aspect, for example, the oxygen-depleted environment can be an environment whereby oxygen from the air or other sources has been replaced with a gas or other fluid containing little to no oxygen. In another aspect, processing can occur in a vacuum environment, and thus contain little to no oxygen. Additionally, oxygen-containing materials or materials that introduce oxygen into the semiconductor, such as, for example, quartz crucibles, can be avoided. As a practical matter, the term "oxygen-depleted environment" can be used to describe an environment with low levels of oxygen, provided a semiconductor material can be processed therein within the desired tolerances. Thus, environments having low oxygen, or little to no oxygen, are environments in which a semiconductor can be processed as a low-oxygen content semiconductor while maintaining oxygen levels within the tolerances of the present disclosure. In one aspect, an oxygen-depleted environment can be an oxygen-free environment. Further details regarding low-oxygen content semiconductor materials can be found in U.S. patent application Ser. No. 12/771,848, filed on Apr. 30, 2010, which is incorporated herein by reference.

The semiconductor material can have varying levels of interstitial oxygen depending on the desired efficiency of the device. In some aspects, oxygen content may be of no concern, and thus any level of oxygen within the lattice is acceptable. In other aspects, a low oxygen content is desired. In one aspect a semiconductor material can have an oxygen content that is less than or equal to about 50 ppm atomic. In another aspect, a semiconductor material can have an oxygen content that is less than or equal to about 30 ppm atomic. In yet another aspect, the semiconductor material can have an oxygen content less than or equal to about 10 ppm atomic. In another aspect the semiconductor can have an oxygen content less than about 5 ppm atomic. In yet another aspect the semiconductor can have an oxygen content less than about 1 ppm atomic.

As has been described, the textured region can function to diffuse electromagnetic radiation, to redirect electromagnetic radiation, and to absorb electromagnetic radiation, thus increasing the quantum efficiency of the device. The textured region can include surface features to increase the effective absorption length of the photosensitive pixel. The surface features can be cones, pyramids, pillars, protrusions, micro lenses, quantum dots, inverted features and the like. Factors such as manipulating the feature sizes, dimensions, material type, dopant profiles, texture location, etc. can allow the diffusing region to be tunable for a specific wavelength. In one aspect, tuning the device can allow specific wavelengths or ranges of wavelengths to be absorbed. In another aspect, tuning the device can allow specific wavelengths or ranges of wavelengths to be reduced or eliminated via filtering.

Tuning can also be accomplished through the location of the texture region within the device, modifying the dopant profile(s) of regions within the device, dopant selection, and the like. Additionally, material composition near the textured region can create a wavelength specific photosensing pixel device. It should be noted that a wavelength specific photosensing pixel can differ from one pixel to the next, and can be incorporated into an imaging array. For example a 4×4 array can include a blue pixel, a green pixel, a red pixel, and infrared light absorbing pixel, or a blue pixel, two green pixels, and a red pixel.

Textured regions according to aspects of the present disclosure can allow a photosensitive device to experience multiple passes of incident electromagnetic radiation within the device, particularly at longer wavelengths (i.e. infrared). Such internal reflection increases the effective absorption length to be greater than the thickness of the semiconductor substrate. This increase in absorption length increases the quantum efficiency of the device, leading to an improved signal to noise ratio.

The textured region can be formed by various techniques, including lasing, chemical etching (e.g. anisotropic etching, isotropic etching), nanoimprinting, additional material deposition, and the like. For example, pillar features can be incorporated into pixels by thinning or removing material from the backside of a FSI semiconductor substrate by using deep trench isolation and etching techniques. In one aspect material can be removed to a thickness of about 20 µm. Anisotropic etching can be used to produce a sloping backside pyramid structure, spherical, structure parabolic structure, a lens structure with reflectors, and the like. Such features on the backside of pillars will also serve to diffuse and reflect electromagnetic radiation.

In one aspect, the texturing process can be performed during the manufacture of the photosensitive device. In another aspect, the texturing process can be performed on a photosensitive device that has previously been made. For example, a CMOS, CCD, or other photosensitive element can be textured following manufacture. In this case, material layers may be removed from the photosensitive element to expose the semiconductor substrate or bulk material upon which a textured region may be formed.

One effective method of producing a textured region is through laser processing. Such laser processing allows discrete locations of the semiconductor substrate to be textured. A variety of techniques of laser processing to form a textured region are contemplated, and any technique capable of forming such a region should be considered to be within the present scope. Laser treatment or processing can allow, among other things, enhanced absorption properties and thus increased electromagnetic radiation focusing and detection. The laser treated region can be associated with the surface nearest the impinging electromagnetic radiation, or the laser treated surface can be associated with a surface opposite in relation to impinging electromagnetic radiation, thereby allowing the radiation to pass through the semiconductor material before it hits the laser treated region.

In one aspect, for example, a target region of the semiconductor material can be irradiated with laser radiation to form a textured region. Examples of such processing have been described in further detail in U.S. Pat. Nos. 7,057,256, 7,354,792 and 7,442,629, which are incorporated herein by reference in their entireties. Briefly, a surface of a semiconductor material is irradiated with laser radiation to form a textured or surface modified region. Such laser processing can occur with or without a dopant material. In those aspects whereby a dopant is used, the laser can be directed through a dopant carrier and onto the semiconductor surface. In this way, dopant from the dopant carrier is introduced into the target region of the semiconductor material. Such a region incorporated into a semiconductor material can have various benefits in accordance with aspects of the present disclosure. For example, the target region typically has a textured surface that increases the surface area of the laser treated region and increases the probability of radiation absorption via the mechanisms described herein. In one aspect, such a target region is a substantially textured surface including micron-sized and/or nano-sized surface features that have been generated by the laser texturing. In another aspect, irradiating the surface of semiconductor material includes exposing the laser radiation to a dopant such that irradiation incorporates the dopant into the semiconductor. Various dopant materials are known in the art, and are discussed in more detail herein.

Thus the surface of the semiconductor material is chemically and/or structurally altered by the laser treatment, which may, in some aspects, result in the formation of surface features appearing as microstructures or patterned areas on the surface and, if a dopant is used, the incorporation of such dopants into the semiconductor material. In some aspects, the features or microstructures can be on the order of 50 nm to 20 µm in size and can assist in the absorption of electromagnetic radiation. In other words, the textured surface can increase the probability of incident radiation being absorbed by the semiconductor material.

The type of laser radiation used to surface modify a semiconductor material can vary depending on the material and the intended modification. Any laser radiation known in the art can be used with the devices and methods of the present disclosure. There are a number of laser characteristics, however, that can affect the surface modification process and/or the resulting product including, but not limited to the wavelength of the laser radiation, pulse width, pulse fluence, pulse frequency, polarization, laser propagation direction relative to the semiconductor material, etc. In one aspect, a laser can be configured to provide pulsatile lasing of a semiconductor material. A short-pulsed laser is one capable of producing femtosecond, picosecond and/or nanosecond pulse durations. Laser pulses can have a central wavelength in a range of about from about 10 nm to about 8 µm, and more specifically from about 200 nm to about 1200 nm. The pulse width of the laser radiation can be in a range of from about tens of femtoseconds to about hundreds of nanoseconds. In one aspect, laser pulse widths can be in the range of from about 50 femtoseconds to about 50 picoseconds. In another aspect, laser pulse widths can be in the range of from about 50 picoseconds to 100 nanoseconds. In another aspect, laser pulse widths are in the range of from about 50 to 500 femtoseconds.

The number of laser pulses irradiating a target region can be in a range of from about 1 to about 2000. In one aspect, the number of laser pulses irradiating a semiconductor target region can be from about 2 to about 1000. Further, the repetition rate or frequency of the pulses can be selected to be in a range of from about 10 Hz to about 10 µHz, or in a range of from about 1 kHz to about 1 MHz, or in a range from about 10 Hz to about 1 kHz. Moreover, the fluence of each laser pulse can be in a range of from about 1 kJ/m$^2$ to about 20 kJ/m$^2$, or in a range of from about 3 kJ/m$^2$ to about 8 kJ/m$^2$.

A variety of dopant materials are contemplated, and any such material that can be used in the laser treatment process to surface modify a semiconductor material according to aspects of the present disclosure is considered to be within the present scope. It should be noted that the particular dopant utilized can vary depending on the semiconductor material being laser treated, as well as the intended use of the resulting semiconductor material. For example, the selection of potential dopants may differ depending on whether or not tuning of the photosensitive device is desired.

A dopant can be either electron donating or hole donating. In one aspect, non-limiting examples of dopant materials can include S, F, B, P, N, As, Se, Te, Ge, Ar, Ga, In, Sb, and combinations thereof. It should be noted that the scope of dopant materials should include, not only the dopant materials themselves, but also materials in forms that deliver such dopants (i.e. dopant carriers). For example, S dopant materials includes not only S, but also any material capable being used to dope S into the target region, such as, for example, $H_2S$, $SF_6$, $SO_2$, and the like, including combinations thereof. In one specific aspect, the dopant can be S. Sulfur can be present at an ion dosage level of between about $5 \times 10^{14}$ and about $1 \times 10^{16}$ ions/cm$^2$. Non-limiting examples of fluorine-containing compounds can include $ClF_3$, $PF_5$, $F_2SF_6$, $BF_3$, $GeF_4$, $WF_6$, $SiF_4$, HF, $CF_4$, $CHF_3$, $CH_2F_2$, $CH_3F$, $C_2F_6$, $C_2HF_5$, $C_3F_8$, $C_4F_8$, $NF_3$, and the like, including combinations thereof. Non-limiting examples of boron-containing compounds can include $B(CH_3)_3$, $BF_3$, $BCl_3$, BN, $C_2B_{10}H_{12}$, borosilica, $B_2H_6$, and the like, including combinations thereof. Non-limiting examples of phosphorous-containing compounds can include $PF_5$, $PH_3$, and the like, including combinations thereof. Non-limiting examples of chlorine-containing compounds can include $Cl_2$, $SiH_2Cl_2$, HCl, $SiCl_4$, and the like, including combinations thereof. Dopants can also include arsenic-containing compounds such as $AsH_3$ and the like, as well as antimony-containing compounds. Additionally, dopant materials can include mixtures or combinations across dopant groups, i.e. a sulfur-containing compound mixed with a chlorine-containing compound. In one aspect, the dopant material can have a density that is greater than air. In one specific aspect, the dopant material can include Se, $H_2S$, $SF_6$, or mixtures thereof. In yet another specific aspect, the dopant can be $SF_6$ and can have a predetermined concentration range of about $5.0 \times 10^{-8}$ mol/cm$^3$ to about $5.0 \times 10^{-4}$ mol/cm$^3$. $SF_6$ gas is a good carrier for the incorporation of sulfur into the semiconductor material via a laser process without significant adverse effects on the semiconductor material. Additionally, it is noted that dopants can also be liquid solutions of n-type or p-type dopant materials dissolved in a solution such as water, alcohol, or an acid or basic solution. Dopants can also be solid materials applied as a powder or as a suspension dried onto the wafer.

The semiconductor substrate can be annealed for a variety of reasons, including dopant activation, semiconductor material damage repair, and the like. In those aspects including a laser textured region, the semiconductor material can be annealed prior to laser treatment, following laser treatment, during laser treatment, or both prior to and following laser treatment. Annealing can enhance the semiconductive properties of the device, including increasing the photoresponse properties of the semiconductor materials. Additionally, annealing can reduce damage done by the lasing process. Although any known anneal can be beneficial and would be considered to be within the present scope, annealing at lower temperatures can be particularly useful. Such a "low temperature" anneal can greatly enhance the photoconductive gain and external quantum efficiency of devices utilizing such materials. In one aspect, for example, the semiconductor material can be annealed to a temperature of from about 300° C. to about 1100 C°. In another aspect, the semiconductor material can be annealed to a temperature of from about 500° C. to about 900° C. In yet another aspect, the semiconductor material can be annealed to a temperature of from about 700° C. to about 800° C. In a further aspect, the semiconductor material can be annealed to a temperature that is less than or equal to about 850° C.

The duration of the annealing procedure can vary according to the specific type of anneal being performed, as well as according to the materials being used. For example, rapid annealing processes can be used, and as such, the duration of the anneal may be shorter as compared to other techniques. Various rapid thermal anneal techniques are known, all of which should be considered to be within the present scope. In one aspect, the semiconductor material can be annealed by a rapid annealing process for a duration of greater than or equal to about 1 µs. In another aspect, the duration of the rapid annealing process can be from about 1 µs to about 1 ms. As another example, a baking or furnace anneal process can be used having durations that may be longer compared to a rapid anneal. In one aspect, for example, the semiconductor material can be annealed by a baking anneal process for a duration of greater than or equal to about 1 ms to several hours. As has been described, if low oxygen content semiconductor materials are used it may be beneficial to anneal such materials in a substantially oxygen-depleted environment.

As has been described, annealing can help reduce defects inherent to the semiconductor substrate and otherwise reduce electron/hole recombination. In other words, the annealing can help create electron states that effectively reduce the undesirable recombination processes. Annealing the semiconductor material may also improve the responsivity or photoconductive gain of the device. Photoconductive devices can have dopants, impurities, or defects that can introduce energy levels that can trap carriers. Trapping carriers and reducing recombination of photocarriers can lead to an increase in photoconductive gain of the device. The relationship of photoconductive gain and trapping time can be represented by Equation (I):

$$\text{Gain} = \tau_L / \tau_t \qquad (I)$$

where "$\tau_L$" is the lifetime of an excess carrier and "$\tau_t$" is the transit time of the carriers across the device. It is understood that the lifetime of an excess carrier can be increased by trapping a carrier species and reducing the recombination rate. An increase in gain can be achieved by trapping centers in the semiconductor that have millisecond trapping times at room temperature and short transit times in thinned lightly doped wafers. These trapping locations can decrease the recombination of carriers and therefore improve or increase the photoconductive gain of the device by allowing more electrons to traverse the different regions without being recombined.

Figure 2:
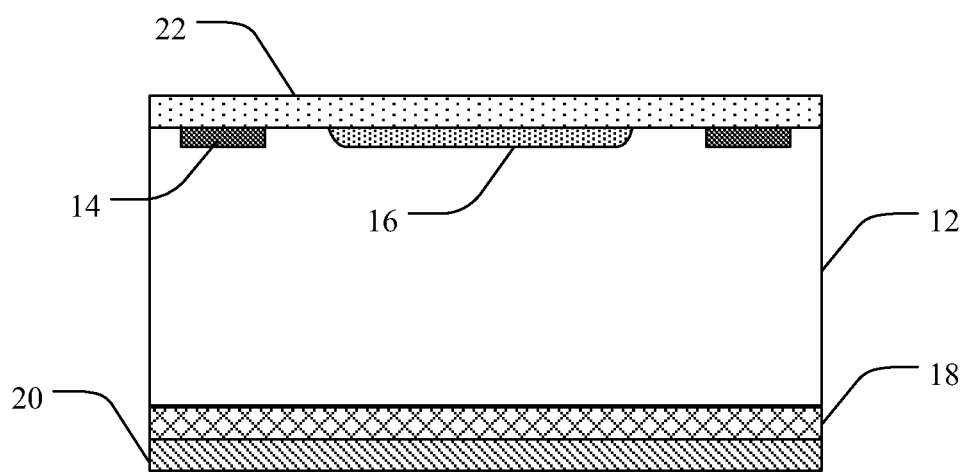
FIG. 2 is a schematic view of a photosensitive device in accordance with another aspect of the present disclosure.

Turning to FIG. 2, a reflecting layer 20 can be coupled to the semiconductor substrate 12. The reflecting layer can be coupled to any side or portion of the semiconductor substrate in order to reflect electromagnetic radiation back into the device. Accordingly, in one aspect the reflecting layer can be located on the semiconductor substrate opposite the incoming electromagnetic radiation. Thus, as is shown in FIG. 2, electromagnetic radiation passing though the semiconductor substrate and the textured region 16 can be reflected back into the semiconductor substrate. Additionally, a passivation layer 22 can be coupled to the semiconductor substrate. The passivation layer is shown coupled to the side of the semiconductor substrate facing the incoming electromagnetic radiation, however a passivation layer can be located anywhere on the device and still be within the present scope.

As has been described, location of the textured region can be used to provide enhancement and/or filtering of the incoming electromagnetic radiation. For example, a textured region located at the point of entry of the electromagnetic radiation into the photosensitive device tends to bend the electromagnetic radiation, particularly the blue wavelengths. Accordingly, one level of tuning can be accomplished by locating the textured region on the surface adjacent the incident electromagnetic radiation to purposely effectuate the filtering of blue wavelengths. Additionally, absorption of particular wavelengths of electromagnetic radiation occurs at different depths in the semiconductor layer and/or textured region. By increasing the absorption to green wavelengths, for example, the electrical signal as a result of green wavelengths can be increased in a diode or pixel. Certain traditional 4 pixel imagers have one red, one blue, and two green pixels, with the greater number of green pixels to account for increased sensitivity of the human eye to green colors. Thus in one aspect, a 4 pixel imager can have one blue, one red, and one green pixel having an increased green wavelength absorption. The fourth pixel can be used for an IR or other wavelength selective pixel depending on the desired application of the imager.

Figure 3:
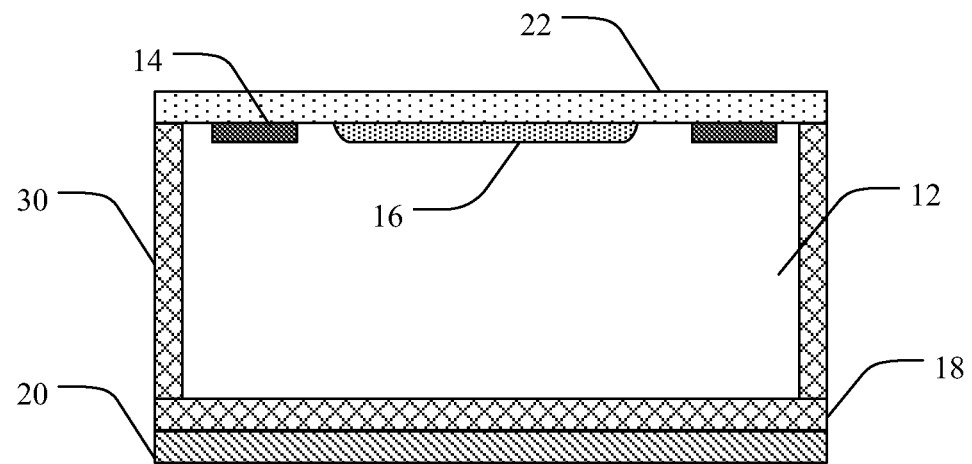
FIG. 3 is a schematic view of a photosensitive device in accordance with yet another aspect of the present disclosure.

FIG. 3 shows a photosensitive device having textured regions 30 located on the sides of the semiconductor substrate 12. Such a configuration allows electromagnetic radiation normally exiting through the sides of the device to be further defused and absorbed within semiconductor substrate. The textured region(s) can be located on one or more sides to facilitate the enhanced absorption.

Figure 4:
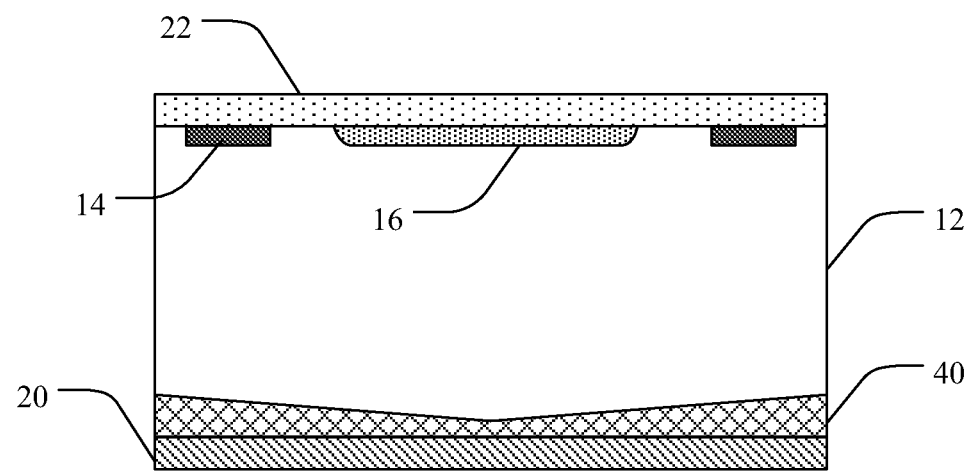
FIG. 4 is a schematic view of a photosensitive device in accordance with a further aspect of the present disclosure.

FIG. 4 shows a photosensitive device having a textured region 40 having a nonparallel surface with respect to the semiconductor substrate 12. Thus the overall configuration of the textured region can be designed to further enhance absorption and/or selectively tune the device. As has been described, the nonparallel surface can have a variety of configurations, such as, without limitation, nonparallel slope, a pyramid, an inverted pyramid, a concave shape, a convex shape, and the like. In some cases the configuration of the textured region can function to direct or focus electromagnetic radiation into the semiconductor substrate, and in other cases the configuration of the textured region can function to direct or focus electromagnetic radiation away from the semiconductor substrate.

Figure 5:
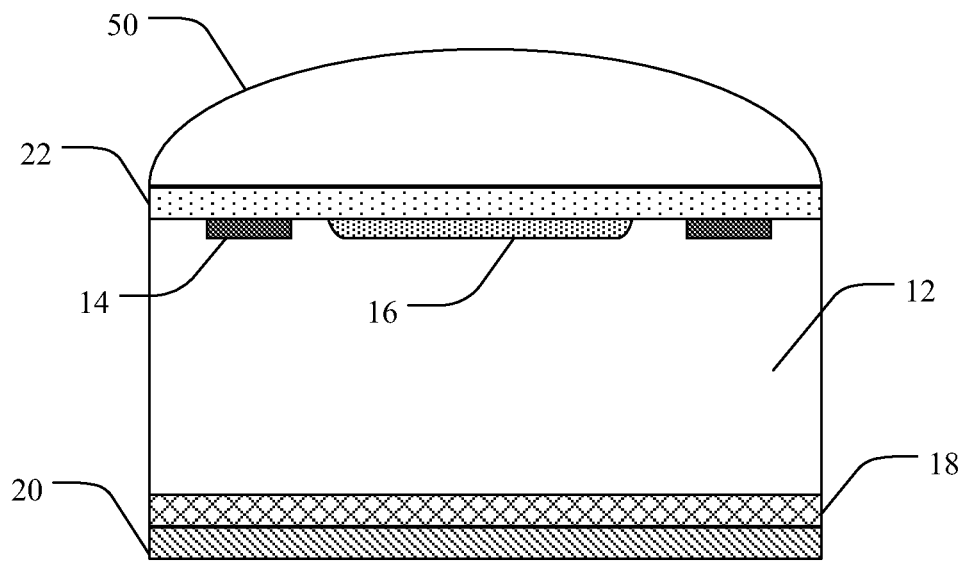
FIG. 5 is a schematic view of a photosensitive device in accordance with yet a further aspect of the present disclosure.

As is shown in FIG. 5, a lens 50 can be coupled to the semiconductor substrate 12 on a side facing incoming electromagnetic radiation. Thus the lens can focus the electromagnetic radiation into the semiconductor substrate. In those aspects having circuitry or other structures disposed on the incoming electromagnetic radiation surface, the lens can further focus light around such structures, thereby reducing optical scattering and noise.

Figure 6:
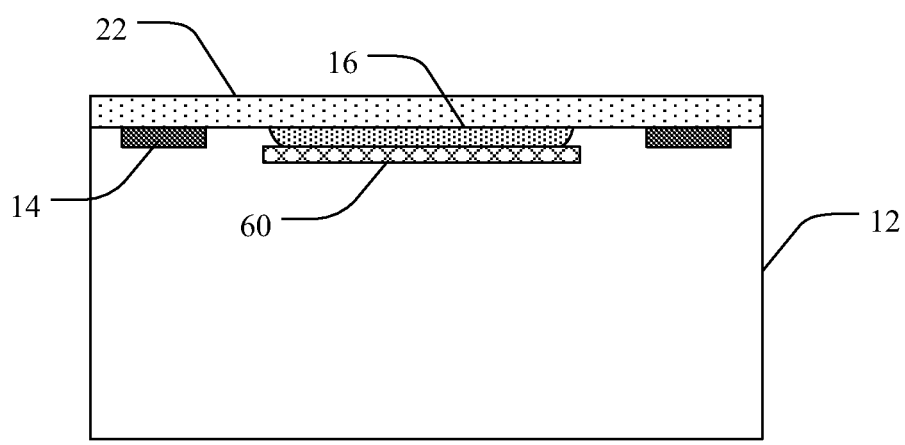
FIG. 6 is a schematic view of a photosensitive device in accordance with another aspect of the present disclosure.

As is shown in FIG. 6, a textured region 60 is located on the semiconductor substrate 12 adjacent to the multiple doped regions 14, 16. The textured region can be associated with at least one of the doped regions as is shown, or the textured region can be distinct from the doped regions (not shown). Electromagnetic radiation can enter the photosensitive device at the side adjacent the doped regions, or alternatively at the side opposite the doped regions.

Figure 7:
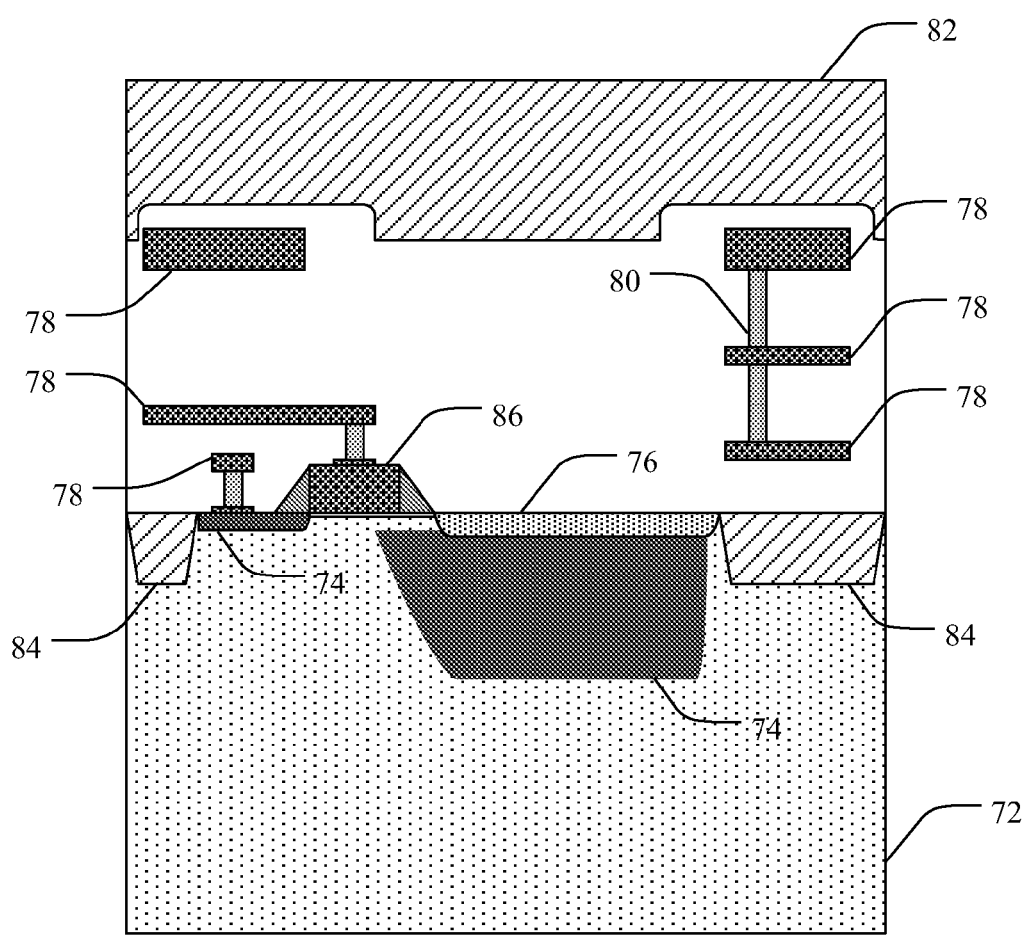
FIG. 7 is a schematic view of a photosensitive pixel device in accordance with yet another aspect of the present disclosure.

FIGS. 7-11 show various steps in the manufacture of a photosensitive pixel according to aspects of the present disclosure. FIG. 7 shows a cross-section of a front side illumination (FSI) photosensitive pixel device. The photosensitive pixel device can include a semiconductor substrate 72, and can be referred to as bulk semiconductor material. The semiconductor substrate includes at least one doped region 74 that can be doped with an electron donating or hole donating species to cause the region to become more positive or negative in polarity as compared to the semiconductor substrate. In one aspect, for example, the doped region can be p doped. In another aspect the doped region can be n doped. A highly doped region 76 can be formed on or near the doped region to create a pinned diode. In one example, the semiconductor substrate can be negative in polarity, and the doped region and the highly doped region can be doped with p+ and n− dopants respectively. In some aspects, variations of n(−−), n(−), n(+), n(++), p(−−), p(−), p(+), or p(++) type doping of the regions can be used. It should be noted that in one aspect the highly doped region can be the textured region. In other words, textured surface features can be formed on or in the highly doped region.

Figure 12:
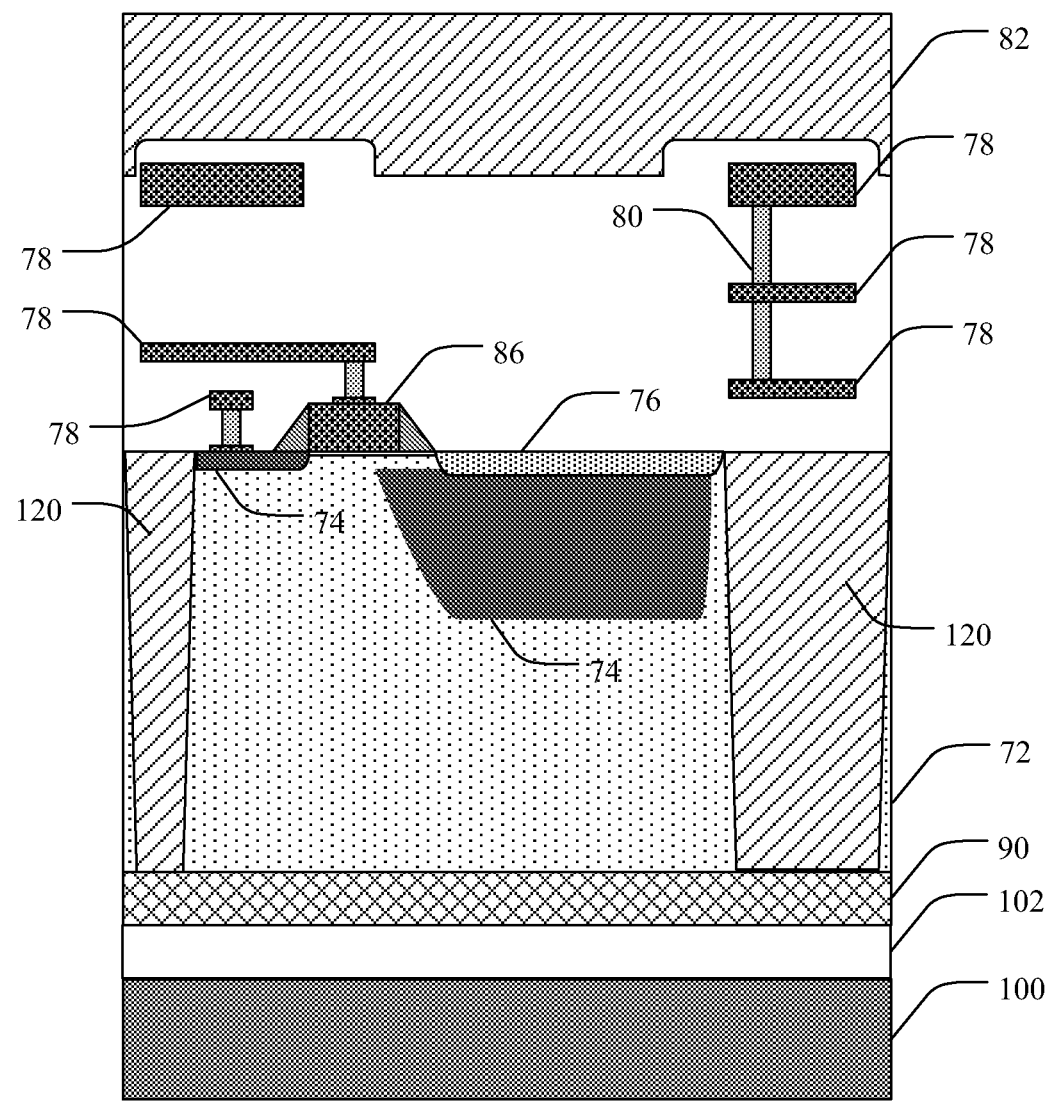
FIG. 12 is a schematic view of a photosensitive pixel device in accordance with a further aspect of the present disclosure.

The device of FIG. 7 can further include various metal regions 78, at least one via 80, a passivation layer 82, trench isolation 84, and an electrical transfer element 86. Trench isolation elements can maintain pixel to pixel uniformity by reducing optical and electrical crosstalk. The trench isolation can be shallow (FIG. 7) or deep (FIG. 12) trench isolation. The trench isolation can include various materials, including, without limitation, dielectric materials, reflective materials, conductive materials, light diffusing features, and the like. These trench isolation regions can be configured to reflect incident light until it is absorbed, thereby increase the effective absorption length of the device.

Figure 8:
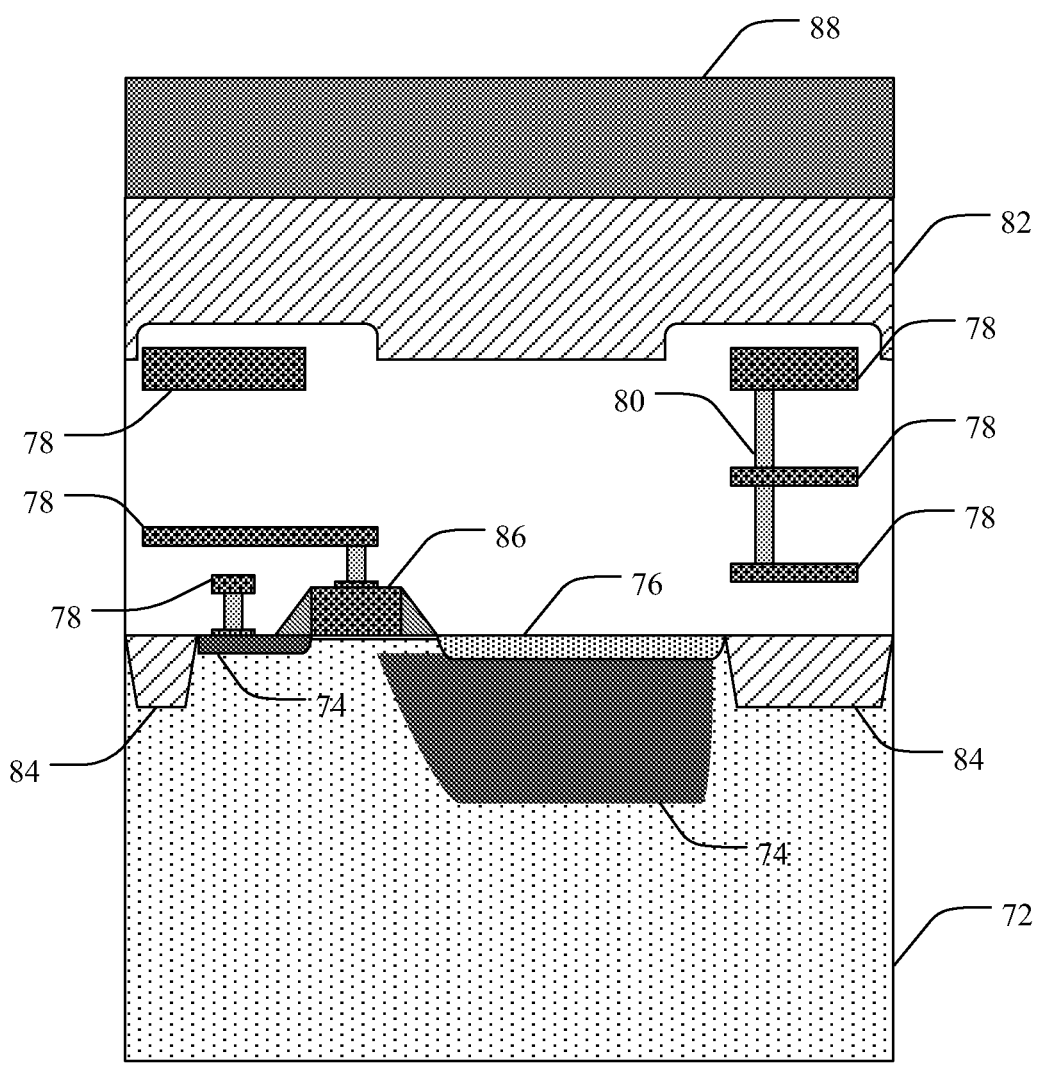
FIG. 8 is a schematic view of a photosensitive pixel device in accordance with a further aspect of the present disclosure.

As is shown in FIG. 8, a carrier substrate or carrier wafer 88 can be coupled to the photosensing pixel. In one aspect, the carrier substrate can be disposed on the passivation layer 82, although the carrier substrate can be disposed on any surface of the device. In one aspect, for example, the carrier substrate can be disposed on the semiconductor substrate (not shown). The carrier substrate can be coupled to the photosensing pixel by various techniques, and any such coupling mechanism is within the present scope. In one aspect, for example, the coupling can occur by way of a bonding layer or adhesive layer disposed on the device, for example, on the passivation layer. The support substrate can provide support to the semiconductor device both during and after manufacture, depending on whether or not the support is removed. The carrier substrate can be made of a semiconductor material that is the same or similar to the bulk semiconductor material, or it can be made of a different material.

Figure 9:
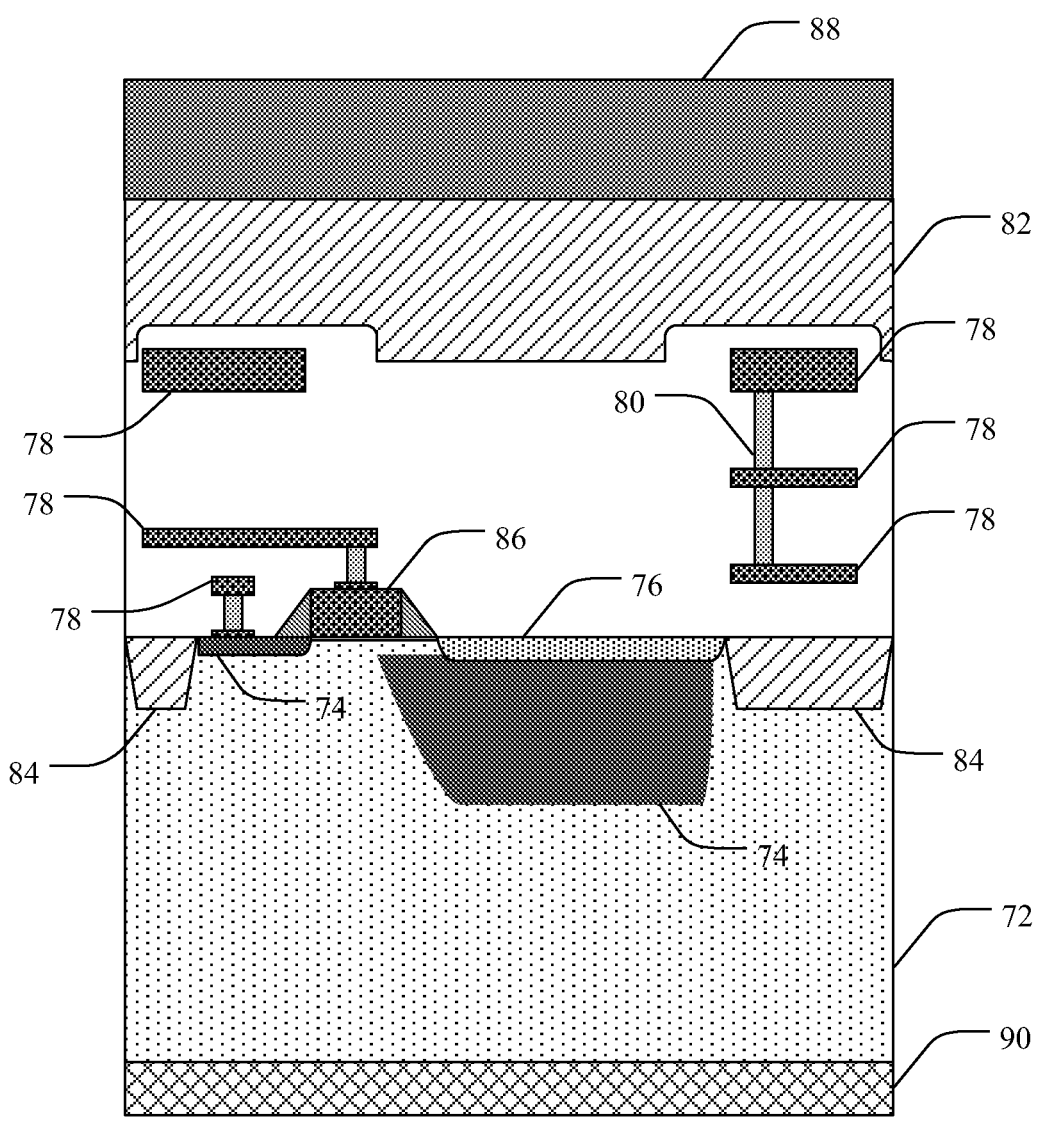
FIG. 9 is a schematic view of a photosensitive pixel device in accordance with yet a further aspect of the present disclosure.

As is shown in FIG. 9, a textured region 90 is coupled to the semiconductor substrate 72 opposite the doped regions 74, 76. Thus light entering from the direction of the doped regions passes through the semiconductor substrate prior to contacting the textured region. The textured region can be disposed across an entire surface of the semiconductor substrate, as is shown in FIG. 9, or it can be disposed on one or more discrete regions (not shown).

Figure 10:
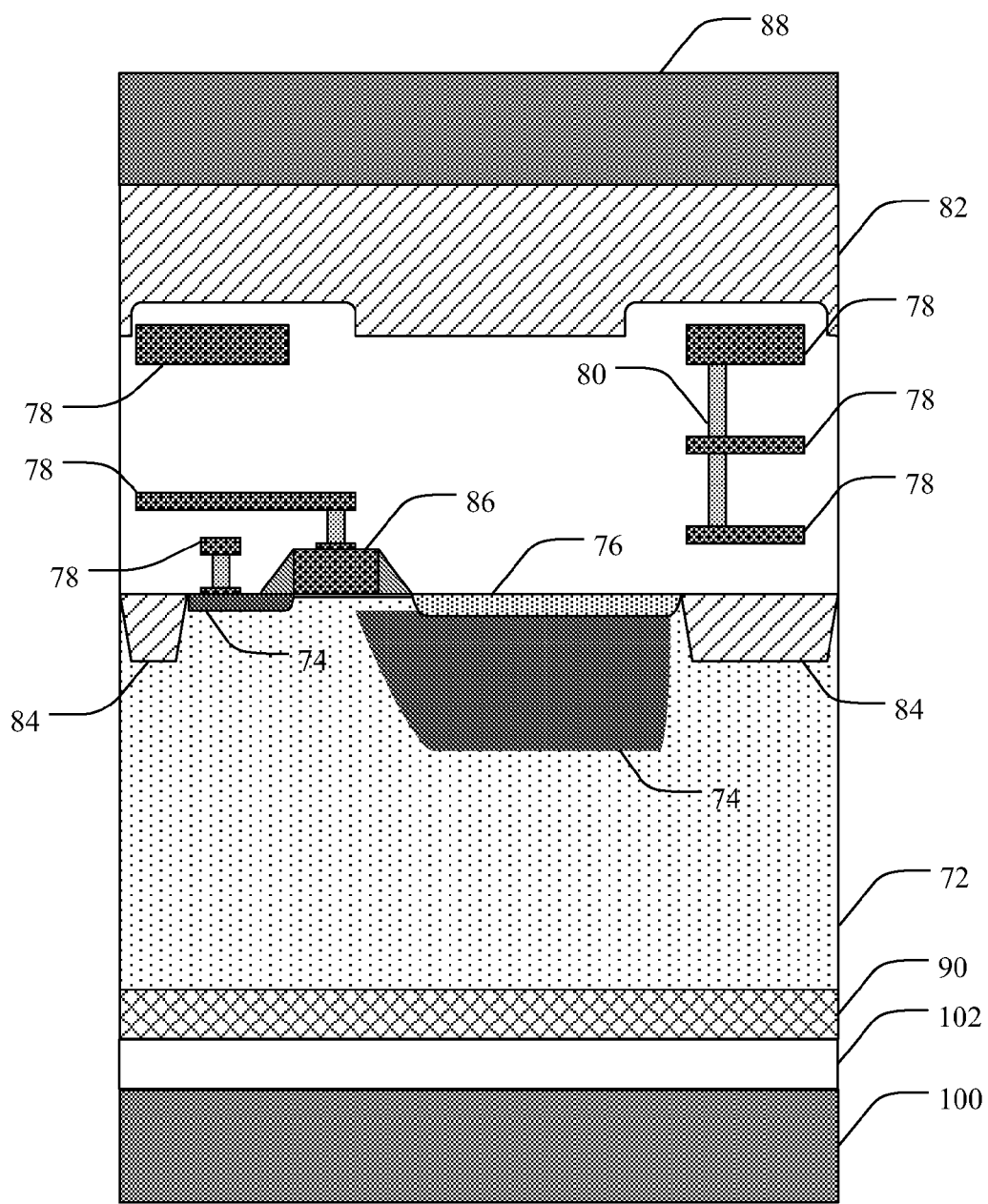
FIG. 10 is a schematic view of a photosensitive pixel device in accordance with another aspect of the present disclosure.

As is shown in FIG. 10, an additional carrier support substrate 100 can be coupled to the device on an opposing side from the carrier support substrate 88. The additional carrier support substrate can be utilized for a variety of purposes, including providing additional support to the device, facilitating the removal of the first carrier support substrate, and the like. A reflective layer 102 can be disposed between the textured region 90 and the carrier support substrate. Thus the reflective layer can reflect electromagnetic radiation that passes through the textured region back toward the semiconductor substrate 72, thus reducing optical loss and backscattering. Thus, in some aspects a reflective layer can increase the quantum efficiency of the device. The reflective layer material can be any reflective material that can be incorporated into such a device. Nonlimiting examples can include materials such as silver, aluminum, and the like.

Figure 11:
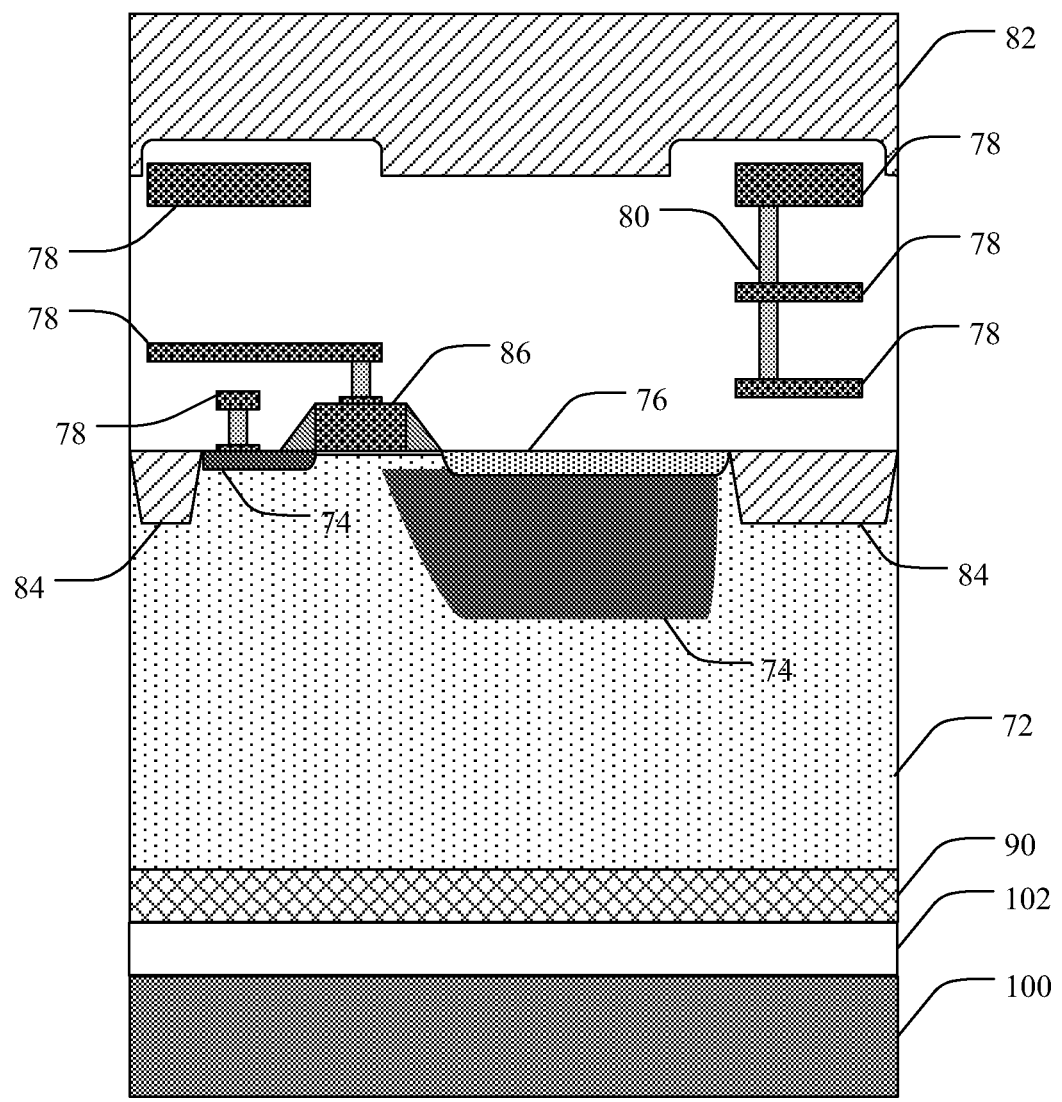
FIG. 11 is a schematic view of a photosensitive pixel device in accordance with yet another aspect of the present disclosure.

As is shown in FIG. 11, the carrier support substrate can be removed to expose the passivation layer 82 or any other material layer that was previously covered by the carrier support substrate. The additional carrier substrate 100 can be maintained in the device, removed from the device, or thinned to reduce the thickness of the substrate depending on the intended use of the device. The removal of material from the device, including the carrier support substrate and the additional carrier substrate, can be accomplished by a variety of methods including, without limitation, etching, chemical mechanical polishing, ion implanting (i.e. smart cut), and the like.

Figure 13:
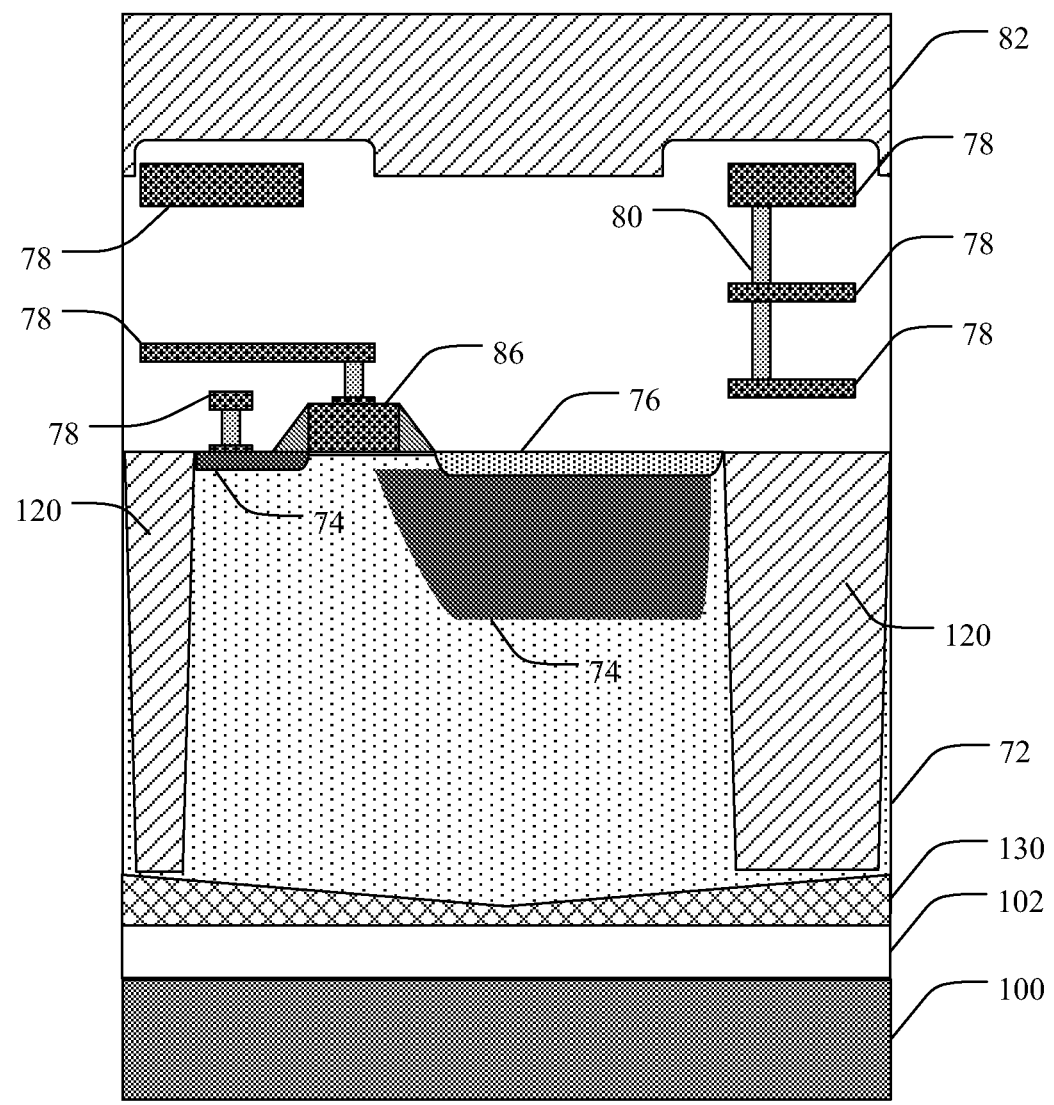
FIG. 13 is a schematic view of a photosensitive pixel device in accordance with another aspect of the present disclosure.

Various types of trench isolation are contemplated, and any such isolation is considered to be within the present scope. As has been described, trench isolation can be shallow (FIG. 7, 84) or deep (FIG. 12, 120) trench isolation. The trench isolation can also include depths between shallow and deep, depending on the device design. Trench isolation can include dielectric materials, reflective materials, conductive materials, and combinations thereof, including textured regions and other light diffusing features. Thus the trench isolation layer can be configured to reflect incident electromagnetic radiation, in some cases until it is absorbed, thereby increasing the effective absorption length of the device. Additionally, in some aspects pillar features can be incorporated into pixels by thinning or removing material from the semiconductor substrate using deep trench isolation and etching techniques. As is shown in FIG. 13, the textured region 130 can have a nonparallel surface with respect to the semiconductor substrate 72 as has been described. This nonparallel morphology, when included with the deep trench isolation 120, can effectively focus electromagnetic radiation into the semiconductor substrate from multiple sides.

It is also contemplated, that a non-bulk material can be formed or disposed near a doped region in the device. The addition of the non-bulk material can allow for electromagnetic radiation diffusing features to be formed on or in the non-bulk material. A metal layer defining an aperture can also be included in one aspect of the present disclosure. The metal layer can be formed near the doped regions and can have a light entering region that defines an aperture. This light entering region can also include an antireflecting material.

Figure 14:
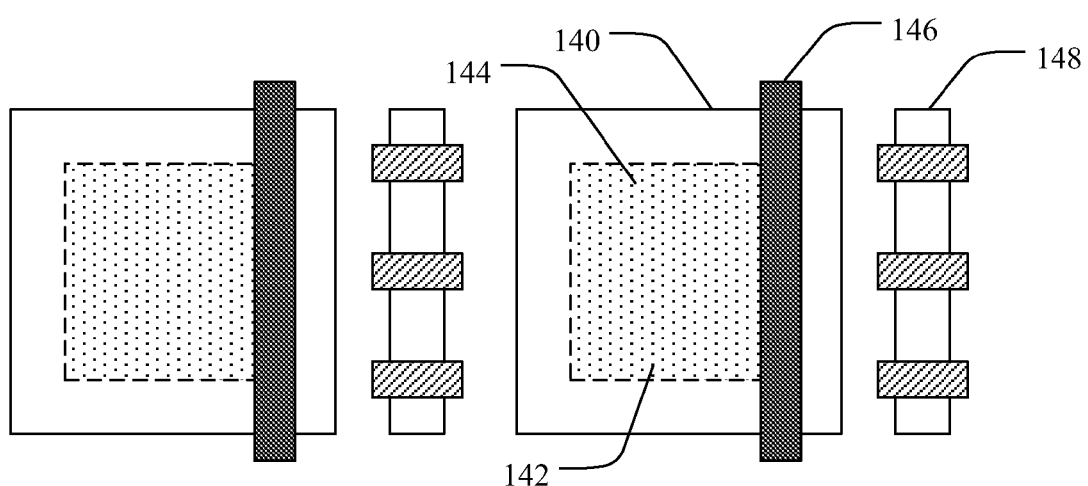
FIG. 14 is a schematic view of a photosensitive imager device in accordance with yet another aspect of the present disclosure.

FIG. 14 shows a photosensitive imager comprising two photosensitive pixels 140. Each photosensitive pixel includes a boundary region 142 that can include metal circuitry and a textured region 144. Each photosensitive pixel can include at least one transistor 146 or other electrical transfer element. Additional read out and circuitry elements 148 can be utilized and shared by both photosensitive pixels.

Figure 15:
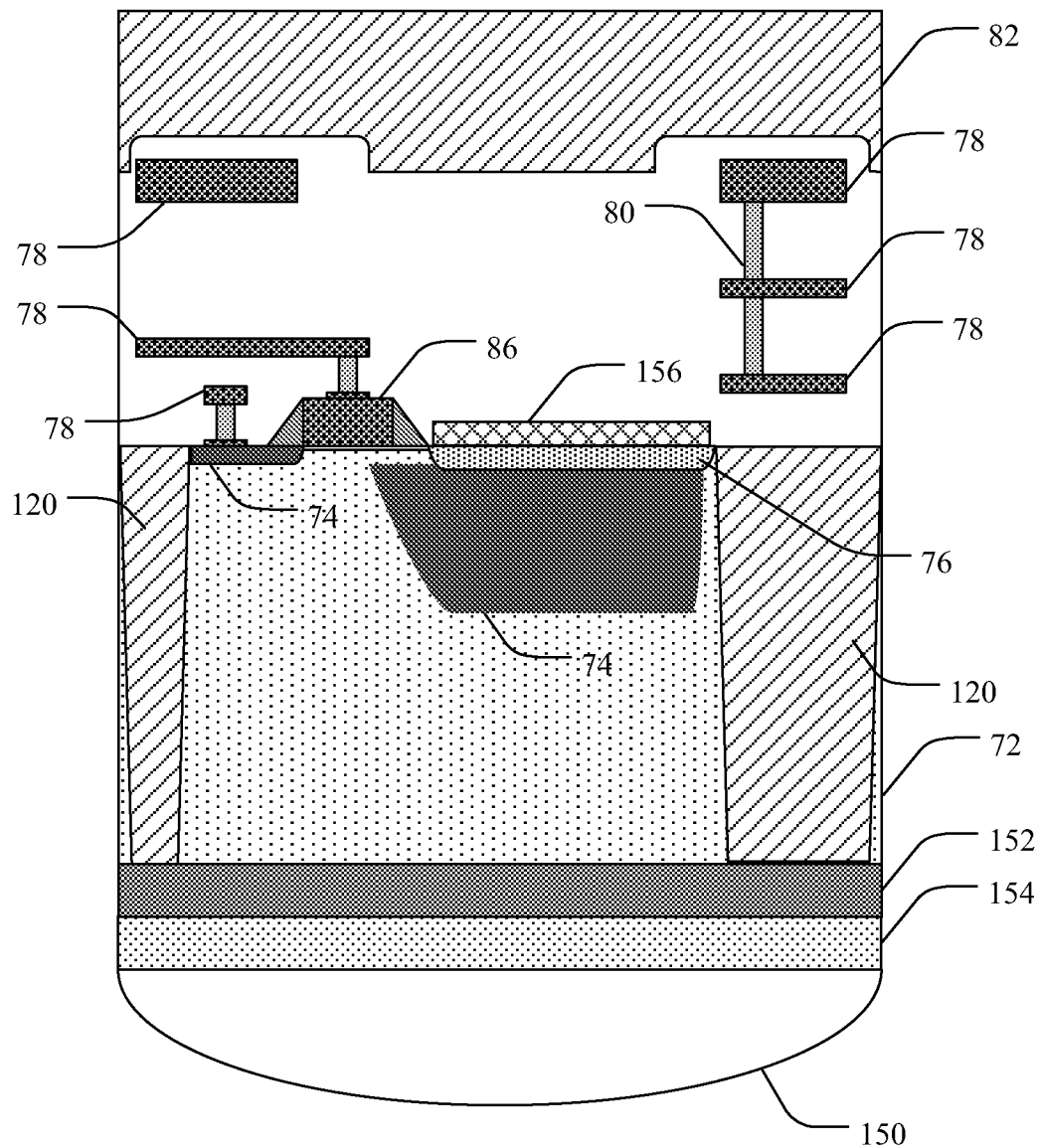
FIG. 15 is a schematic view of a photosensitive pixel device in accordance with a further aspect of the present disclosure.

Turning to FIG. 15, a backside illuminated (BSI) photosensitive pixel according to one aspect present disclosure is provided. A lens 150 and an anti-reflective coating 152 are disposed on the backside of the pixel following thinning and trench isolation. A color filter 154 can be optically coupled to the lens to allow specific wavelengths filtering of the electromagnetic radiation. A textured region 156 can be coupled to the semiconductor substrate 72 opposite the lens in order to provide diffusive scattering and reflection of the incident electromagnetic radiation that passes through to the front side of the pixel. Thus the electromagnetic radiation can be focused within the semiconductor substrate to the combined action of the textured region and the trench isolation 120

Figure 16:
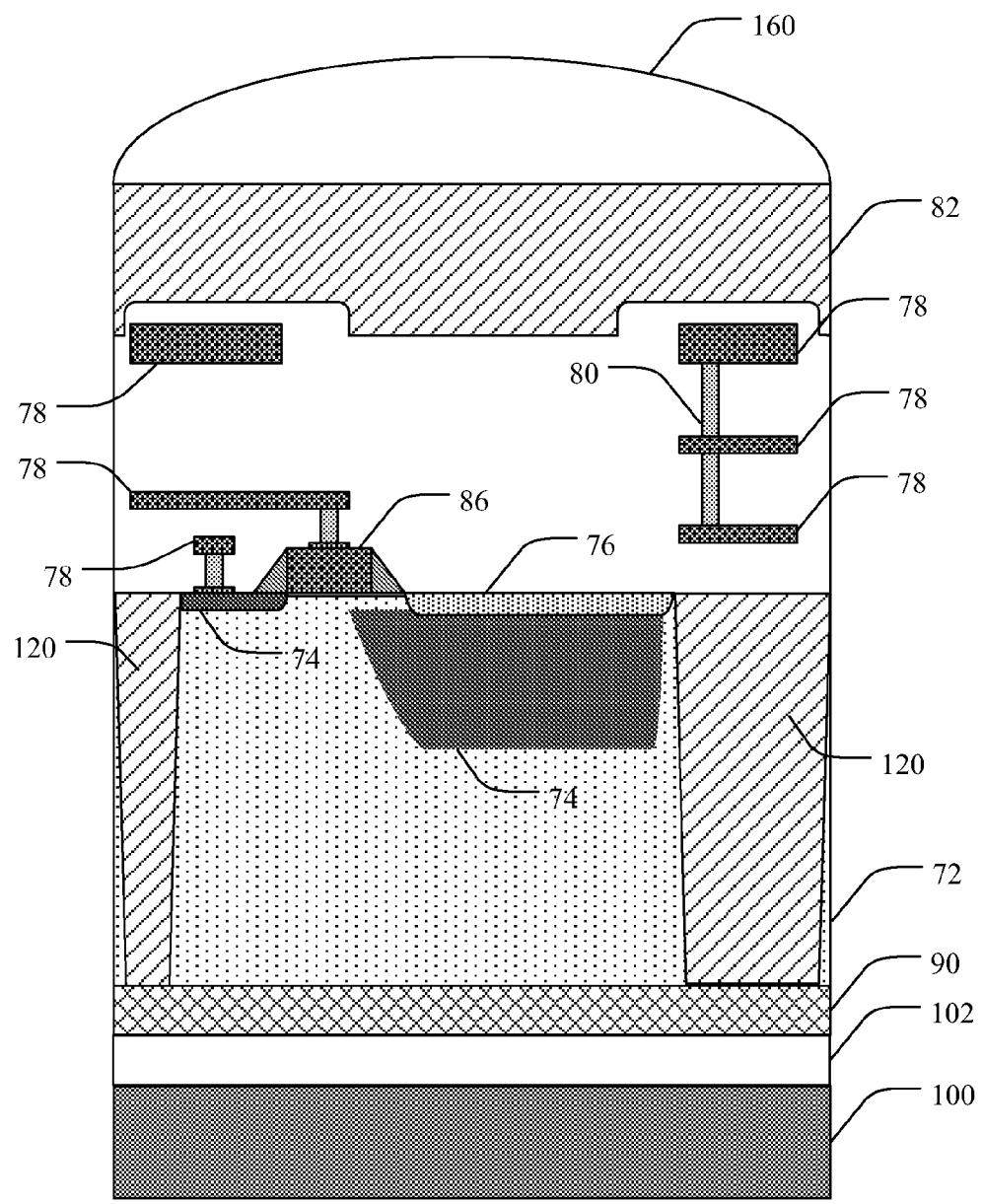
FIG. 16 is a schematic view of a photosensitive pixel device in accordance with another aspect of the present disclosure.

FIG. 16 shows a front side illuminated (FSI) imager according to another aspect of the present disclosure. A lens 160 and an antireflecting passivation layer on 62 are coupled to the front side of the pixel. A textured region 90 and a reflecting layer 102 are coupled to the semiconductor substrate 72 opposite the lens to provide diffusive scattering and reflection of the incident electromagnetic radiation that passes through the semiconductor substrate. An aperture 164 formed in a metal or other reflective material layer 166 can increase the effectiveness of the optical cavity. Thus the lens focuses electromagnetic radiation through the aperture.

Figure 17:
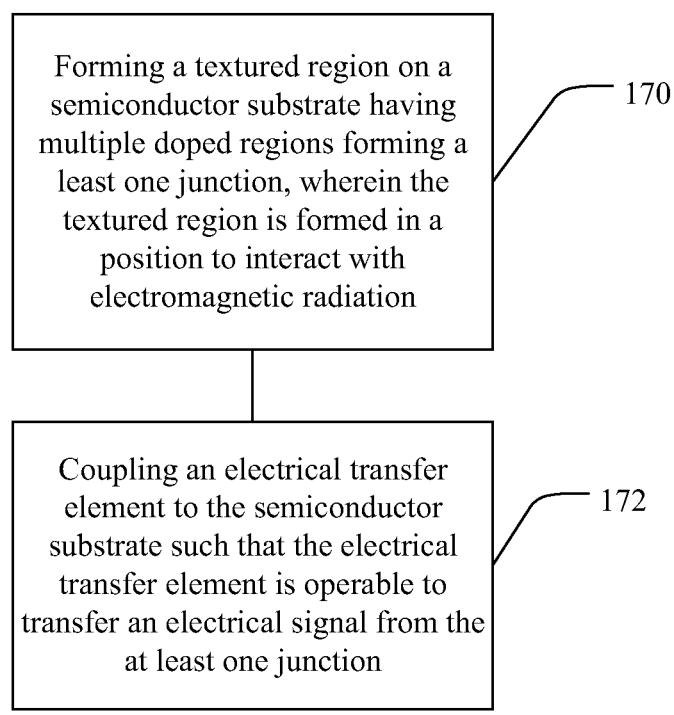
FIG. 17 is a depiction of a method of making a photosensitive imager device in accordance with yet another aspect of the present disclosure.

In other aspects of the present disclosure, various methods of making photosensitive diodes, pixels, and imagers, are contemplated. In one aspect, as is shown in FIG. 17, a method of making a photosensitive imager device can include forming a textured region on a semiconductor substrate having multiple doped regions forming a least one junction, wherein the textured region is formed in a position to interact with electromagnetic radiation 170. The method also includes coupling an electrical transfer element to the semiconductor substrate such that the electrical transfer element is operable to transfer an electrical signal from the at least one junction 172. In one aspect, multiple pixels can be associated together to form an imager. A passivation layer can also be disposed on the photosensitive imager device to protect and/or reduce the dark current of the device.

In another aspect of the present disclosure, a method for making a photosensitive diode is provided. Such a method can include forming at least one cathode and at least one anode on a surface of a semiconductor substrate, coupling a textured region to the semiconductor substrate, and coupling a support substrate to the semiconductor substrate. The textured region can be located adjacent to the anode and cathode, opposite the anode and cathode, or both adjacent and opposite the anode and cathode. An electrical transfer on the can be electrically coupled to at least one of the anode and cathode to form a photosensitive pixel. In another aspect, the semiconductor substrate can be thinned to improve the response rate and/or speed of the device. A passivation layer can also be disposed on the photosensitive diode to protect and/or reduce the dark current of the device. An additional support substrate can be attached to the device to provide additional support. In one aspect, the additional support substrate can be located on the opposite side of the photosensitive diode from the support substrate. The support substrate can subsequently be removed to allow for further processing.

Of course, it is to be understood that the above-described arrangements are only illustrative of the application of the principles of the present disclosure. Numerous modifications and alternative arrangements may be devised by those skilled in the art without departing from the spirit and scope of the present disclosure and the appended claims are intended to cover such modifications and arrangements. Thus, while the present disclosure has been described above with particularity and detail in connection with what is presently deemed to be the most practical embodiments of the disclosure, it will be apparent to those of ordinary skill in the art that numerous modifications, including, but not limited to, variations in size, materials, shape, form, function and manner of operation, assembly and use may be made without departing from the principles and concepts set forth herein.

What is claimed is:

1. A photosensitive imager device, comprising:
   a semiconductor substrate having a substantially planar surface and multiple doped regions forming a least one junction;
   a textured region coupled to the semiconductor substrate on a surface opposite the substantially planar surface and positioned to interact with electromagnetic radiation;
   integrated circuitry formed at the substantially planar surface; and
   an electrical transfer element coupled to the semiconductor substrate and operable to transfer an electrical signal from the at least one junction.

2. The device of claim 1, wherein the transfer element is selected from the group consisting of a transistor, a sensing node, a transfer gate, and combinations thereof.

3. The device of claim 1, further comprising a reflective layer coupled to the semiconductor substrate and positioned to maintain the electromagnetic radiation in the semiconductor substrate.

4. The device of claim 1, wherein the textured region has a surface morphology operable to direct electromagnetic radiation into or out of the semiconductor substrate.

5. The device of claim 4, wherein the surface morphology of the textured region relative to the semiconductor substrate is a member selected from the group consisting of sloping, pyramidal, inverted pyramidal, spherical, parabolic, asymmetric, symmetric, and combinations thereof.

6. The device of claim 1, further comprising an additional textured region positioned on a surface of the semiconductor substrate that is adjacent the multiple doped regions.

7. The device of claim 1, wherein the textured region includes surface features having a size selected from the group consisting of micron-sized, nano-sized, and combinations thereof.

8. The device of claim 7, wherein surface features include a member selected from the group consisting of cones, pillars, pyramids, micolenses, quantum dots, inverted features, and combinations thereof.

9. The device of claim 1, wherein the textured region has been formed by a process selected from the group consisting of lasing, chemical etching, and combinations thereof.

10. The device of claim 1, further comprising a lens optically coupled to the semiconductor substrate and positioned to focus incident electromagnetic radiation into the semiconductor substrate.

11. A photosensitive imager array, comprising at least two photosensitive imager devices of claim 1.

12. The array of claim 11, further comprising at least one trench isolation positioned between the at least two photosensitive imager device.

13. A method of making a photosensitive imager device, comprising:
  forming a textured region on a semiconductor substrate, wherein the semiconductor substrate has a substantially planar surface opposite the textured region and multiple doped regions forming a least one junction, and wherein the textured region is formed in a position to interact with electromagnetic radiation;
  forming integrated circuitry on the substantially planar surface; and
  coupling an electrical transfer element to the semiconductor substrate such that the electrical transfer element is operable to transfer an electrical signal from the at least one junction.

14. The method of claim 13, wherein forming the textured region is by a process selected from the group consisting of lasing, chemical etching, nanoimprinting, material deposition, and combinations thereof.

15. The method of claim 13, wherein forming the textured region includes irradiating a target region with laser radiation to form surface features having a size selected from the group consisting of micron-sized, nano-sized, and combinations thereof.

16. The method of claim 15, wherein irradiating the target region includes exposing the laser radiation to a dopant such that the irradiation incorporates the dopant into the textured region.

17. The method of claim 15, wherein the irradiation is performed using a pulsed laser including a member selected from the group consisting of a femtosecond laser, a picosecond laser, a nanosecond laser, and combinations thereof.

18. The method of claim 13, further comprising tuning an electrical response of the photosensitive imager device.

19. The method of claim 18, wherein tuning includes forming surface features to have dimensions that selectively diffuse or selectively absorb a desired wavelength of electromagnetic radiation.

20. The method of claim 18, wherein tuning is accomplished through a factor selected from the group consisting of placement of the textured region, material type of the textured region, thickness of the textured region, dopant type of the textured region, doping profile of the texture region, doping profile of the semiconductor substrate, thickness of the substrate, and combinations thereof.

21. The method of claim 13, wherein the transfer element is selected from the group consisting of a transistor, a sensing node, a transfer gate, and combinations thereof.

22. The method of claim 13, further comprising annealing the semiconductor substrate to a temperature of from about 300° C. to about 1100° C.

23. A photosensitive imager device, comprising:
  a semiconductor substrate having a substantially planar surface and multiple doped regions forming a least one junction;
  a textured region coupled to the semiconductor substrate on a surface opposite the substantially planar surface and positioned to interact with electromagnetic radiation; and
  at least 4 transistors formed at the substantially planar surface with at least one of the transistors electrically coupled to the at least one junction.

24. The device of claim 9, wherein the textured region has been formed by lasing.

25. The device of claim 24, wherein the textured region has been formed by lasing with short duration laser pulses.

26. The device of claim 1, wherein the semiconductor substrate includes monocrystal silicon.

* * * * *